(12) United States Patent
Leitch

(10) Patent No.: US 6,531,889 B1
(45) Date of Patent: Mar. 11, 2003

(54) DATA PROCESSING SYSTEM WITH IMPROVED LATENCY AND ASSOCIATED METHODS

(75) Inventor: James R. Leitch, Beaconsfield (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/871,919

(22) Filed: Jun. 1, 2001

Related U.S. Application Data

(60) Provisional application No. 60/238,986, filed on Oct. 10, 2000.

(51) Int. Cl.[7] .................. H03K 19/173; H03K 19/00
(52) U.S. Cl. ............................. 326/39; 326/101
(58) Field of Search .................... 326/37–39, 41, 326/101

(56) References Cited

U.S. PATENT DOCUMENTS

| | | | |
|---|---|---|---|
| 5,309,046 A | | 5/1994 | Steele |
| 5,528,170 A | * | 6/1996 | Britton et al. ............... 326/39 |
| 5,572,148 A | * | 11/1996 | Lytle et al. .................. 326/39 |
| 5,966,027 A | * | 10/1999 | Kapusta et al. .............. 326/39 |

OTHER PUBLICATIONS

Chameleon Systems, Inc., "Wireless Base Station Design Using Reconfigurable Communications Processors," 2000, 9 pgs.

Chameleon Systems, Inc. "CS2000 Reconfigurable Communications Processor Family Product Brief," Advance Product Information, 2000, 9 pgs.

"Triscend E5 CSoC Expands Market Reach," 2000, 2 pgs.

"A T94K Series Field Programmable System Level Integrated Circuit," Advance Information, Rev. 1138CS, Atmel Corporation, 12/99, 6 pgs.

"Triscend E5 Configurable System–On–Chip Family," Triscend Corporation, 1998–2000, 92 pgs.

Alan McKenzie et al., "A Versatile Application Bootload For Field Programmable Soc," Technical Developments, Motorola, Sep. 1999, pp. 77–79.

Roger May et al., "A Versatile Application Bootload For Field Programmable Soc," Technical Developments, Motorola, Sep. 1999, p. 80.

"Chip Count is Cut For Baseband Processing," Nick Flaherty, Electronics Times, May 22, 2000, No. 995, p. 16.

"Chameleon's Approach," Chris Edwards, Electronics Times, May 22, 2000, No. 995, p. 16.

* cited by examiner

Primary Examiner—Michael Toker
Assistant Examiner—James A. Cho
(74) Attorney, Agent, or Firm—O'Keefe, Egan & Peterman, LLP

(57) ABSTRACT

An configurable integrated-circuit device includes a plurality of regions that each contain electronic circuitry. The configurable integrated-circuit device also includes common circuitry adapted to provide at least one signal to at least two regions of the plurality of regions. The common circuitry and the at least two regions are positioned within the configurable integrated-circuit device so as to improve the latencies of the at least one signal to each of the at least two regions.

58 Claims, 19 Drawing Sheets

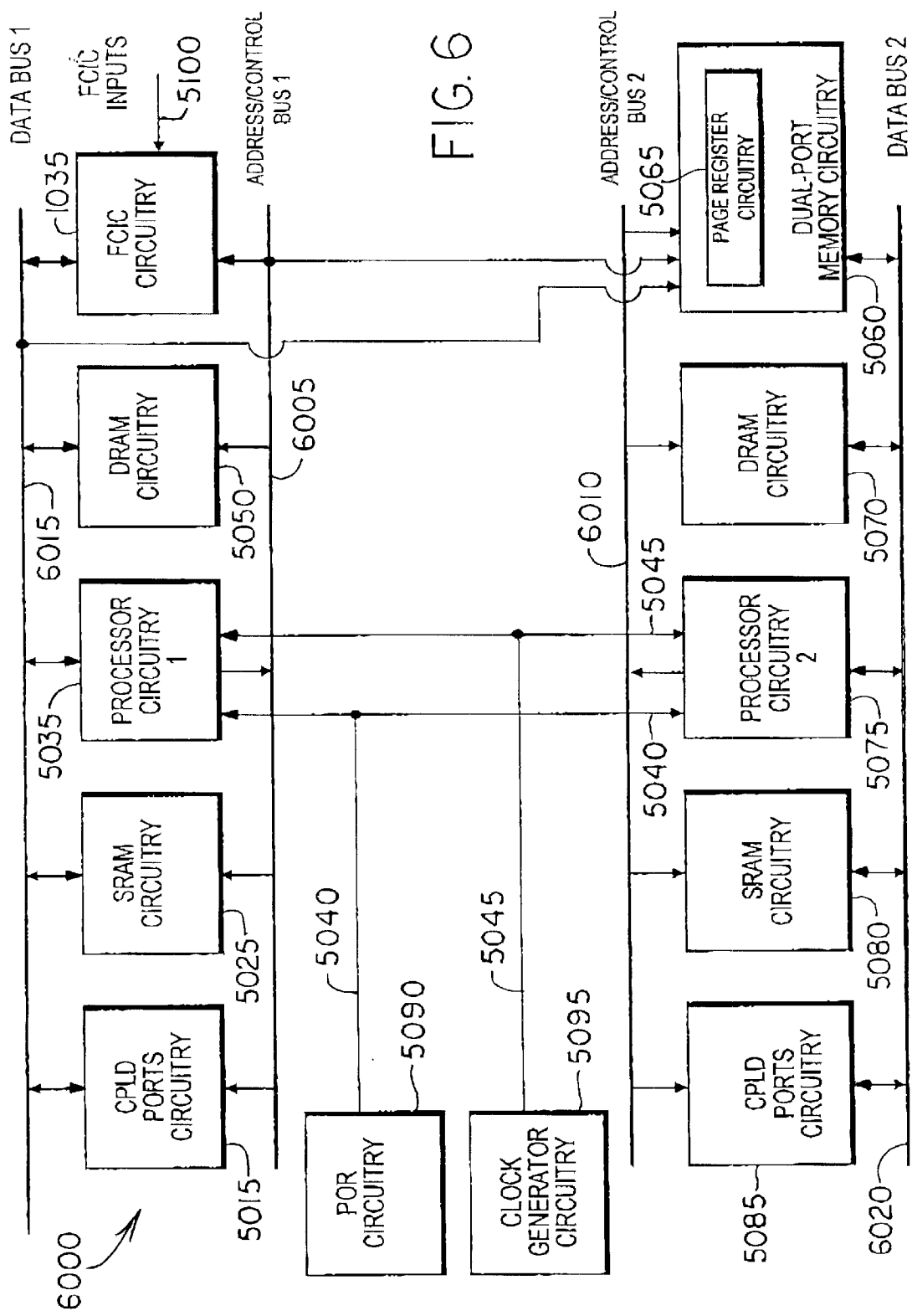

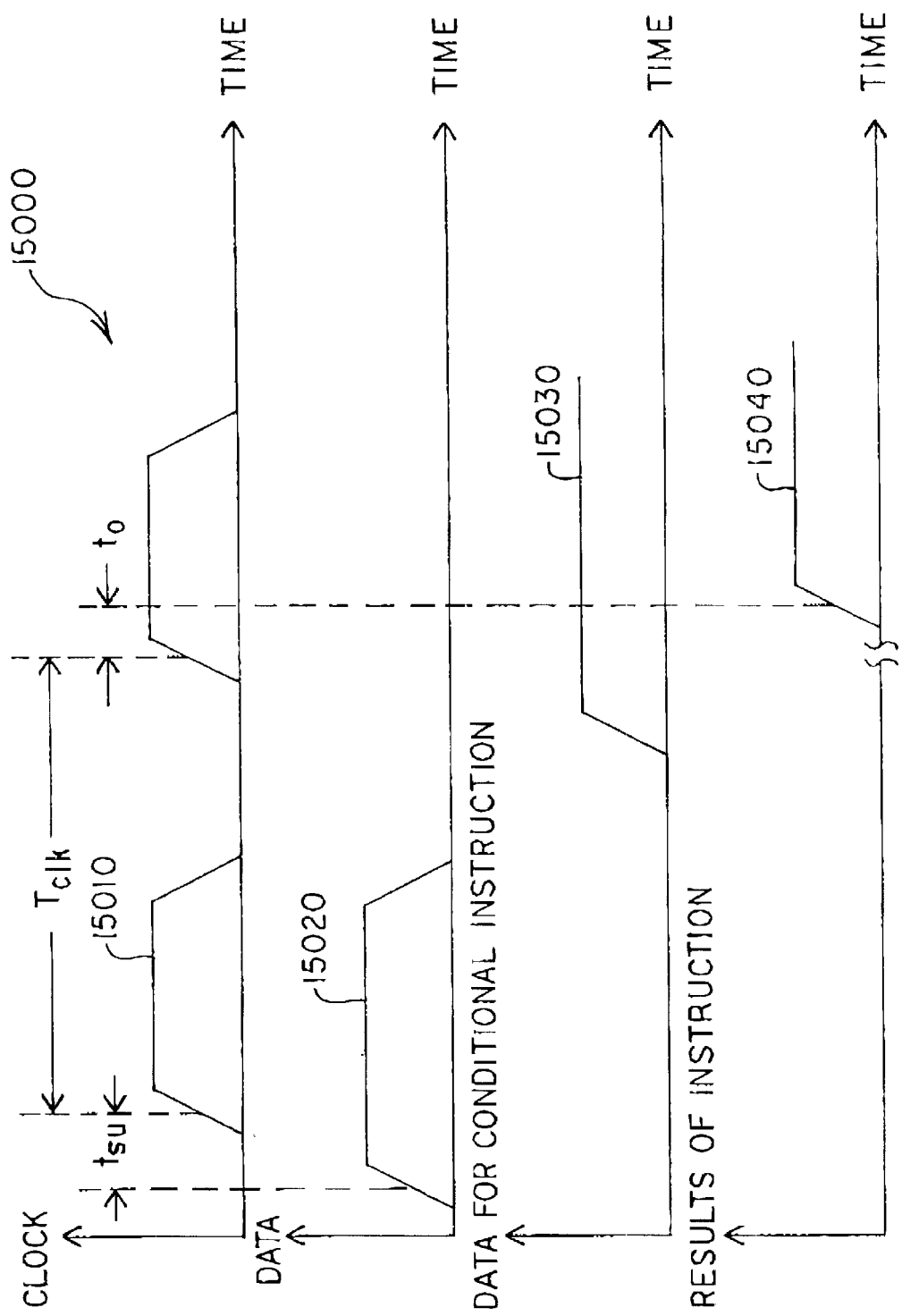
FIG. 15 (Not drawn to scale)

DATA PROCESSING SYSTEM WITH IMPROVED LATENCY AND ASSOCIATED METHODS

CROSS-REFERENCE TO RELATED APPLICATIONS

This patent application claims priority to Provisional U.S. Patent Application Ser. No. 60/238,986, filed on Oct. 10, 2000.

Furthermore, this patent application relates to concurrently filed U.S. patent application Ser. No. 09/872,496, Client Reference No. A640, titled "Apparatus and Methods for Fast Conditional-Instruction Controller Circuitry in Data-Processing Systems."

TECHNICAL FIELD OF THE INVENTION

This invention relates to electronic data-processing systems and, more particularly, to improving latency in a real-time operating environment.

BACKGROUND

Some computer and data processing applications demand real-time response from the computer system. For example, telecommunication and data-communication applications often involve real-time processing of network data as a result of multimedia, audio, and video applications and user-data. The real-time demand often places stringent requirements on the hardware, software, or both.

To address the demands of real-time applications, designers employ sophisticated system designs with correspondingly complex hardware and software components. Complex hardware designs typically include high levels of integration and reside on a large silicon die, for example, within programmable gate-arrays (PGAs), field-programmable gate arrays (FPGAs), programmable logic-devices (PLDs), or complex programmable logic-devices (CPLDs).

Providing a high-performance system with good real-time response entails designing sophisticated software (both embedded software and the development tools accompanying the data-processing system) and high-speed hardware circuitry. Designing a system with still higher performance requires optimized layout of the circuitry on the silicon die. Thus, an optimal system design includes an appropriate mix of the three performance factors, i.e., hardware performance, software performance, and silicon layout. Focusing on any one of these factors may create a partly optimized system, but not an optimal overall solution. Worse yet, failing to provide an optimal silicon layout may negate the advantages of optimized hardware, software, or both. Unfortunately, no comprehensive design approach exists that provides an optimal mix of software performance, hardware performance, and silicon-layout performance.

Another aspect of high-performance data-processing systems relates to the execution of instructions within the processor circuitry. Software instructions that operate on data present within the processor (e.g., within the processor's internal registers) often execute at high speeds, i.e., with low latency. On the other hand, software instructions that operate on data outside the processor, for example, conditional branch instructions, typically suffer from increased latency. The latency results from the time interval it takes the processor to obtain the data and to operate on them to execute the instructions. Typically, a source outside the processor interrupts the processor. In response, the processor uses an interrupt service routine to obtain the data from the outside source, and executes the instruction or instructions that operate on the data. The period from the initial interrupt to the execution of the instruction within the processor often takes many clock cycles. The interrupt-driven scheme results in reduced system performance because of the increased latency. Thus, a need exists for improved latency in the data-processing system when it executes instructions that operate on data residing outside the processor circuitry.

SUMMARY OF THE INVENTION

One aspect of this invention contemplates apparatus for improving latency in data-processing systems. In one embodiment, a configurable integrated-circuit device according to the invention includes a plurality of regions and a common circuitry. Each of the plurality of regions of the integrated-circuit device includes configurable electronic circuitry. The common circuitry provides at least one signal to at least two regions of the plurality of regions. The common circuitry and the at least two regions are positioned within the configurable integrated-circuit device so as to improve the latencies of the at least one signal to each of the at least two regions. A data-processing system according to the invention includes the configurable integrated-circuit device and at least one peripheral circuitry coupled to the configurable integrated-circuit device.

In another embodiment, a configurable integrated-circuit device according to the invention includes a plurality of regions that each include electronic circuitry, and a common circuitry. The common circuitry provides at least one signal to at least two regions of the plurality of regions. The common circuitry and the at least two regions are positioned within the configurable integrated-circuit device so that the latencies of the at least one signal to each of the at least two regions tend to be equalized. A data-processing system according to the invention includes the configurable integrated-circuit device and at least one peripheral circuitry coupled to the configurable integrated-circuit device.

In a third embodiment, a programmable logic device (PLD) according to the invention includes a plurality of regions that each include configurable electronic circuitry, and bus circuitry that couples to the plurality of regions. The PLD also includes common circuitry that couples to the bus circuitry. The common circuitry provides a signal to the plurality of regions through the bus circuitry. The common circuitry and the plurality of regions are positioned within the PLD so as to improve the latencies of the signal to each region. A data-processing system according to the invention includes the PLD and at least one peripheral circuitry coupled to the PLD.

Another aspect of the invention contemplates methods for improving latency in data-processing systems. In a first embodiment, a method according to the invention for improving latency in a configurable integrated-circuit device includes providing the configurable integrated-circuit device, and partitioning the configurable integrated-circuit device into a plurality of regions that each include configurable electronic circuitry. The method also includes within the integrated-circuit device a common circuitry that provides at least one signal to at least two regions of the plurality of regions. The method positions the common circuitry and the at least two regions within the configurable integrated-circuit device so as to improve the latencies of the at least one signal to each of the at least two regions.

In a second embodiment, a method according to the invention for improving latency in a configurable integrated-circuit device includes providing the configurable integrated-circuit device, and partitioning the configurable integrated-circuit device into a plurality of regions that each include configurable electronic circuitry. The method also includes within the configurable integrated-circuit device a common circuitry that provides at least one signal to at least two regions of the plurality of regions. The method positions the common circuitry and the at least two regions within the configurable integrated-circuit device so that the latencies of the at least one signal to each of the at least two regions tend to be equalized.

DESCRIPTION OF THE DRAWINGS

The appended drawings illustrate only exemplary embodiments of the invention and therefore do not limit its scope, because the inventive concepts lend themselves to other equally effective embodiments. Like reference numerals in the drawings identify the same, similar, or equivalent components, blocks, circuitry, structure, or functionality.

FIG. 6 shows a block diagram of another embodiment of a data-processing system according to the invention.

FIG. 15 illustrates an example of a timing diagram that corresponds to a fast conditional instruction controller (FCIC) circuitry according to the invention.

DETAILED DESCRIPTION OF THE INVENTION

Figure 1:
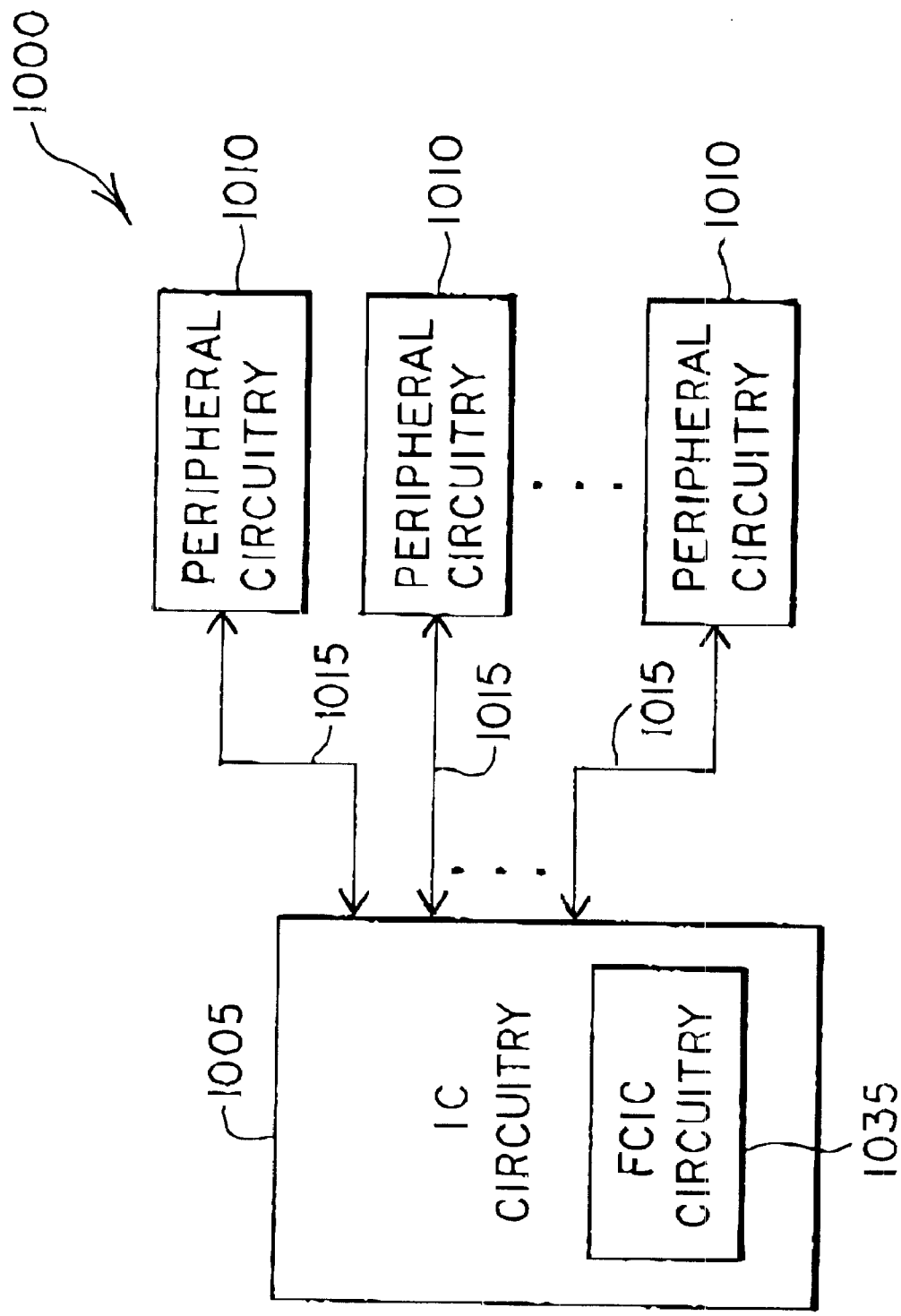
FIG. 1 illustrates a data-processing system that includes an integrated-circuit device according to the invention.

The invention provides a performance-scalable architecture for a data-processing apparatus. A performance-scalable architecture allows a system designer to plan the system design and architecture to meet a desired set of system specifications. For example, a performance-scalable architecture allows a designer to include more or less memory in a given system, depending on factors such as the complexity of the application, amount of data to process, and the like. The scalable architecture addresses the low-latency needs of high-performance applications, yet also works in lower-performance applications where latency specifications may be less stringent. One aspect of the invention provides a solution to the problem of providing a data-processing environment with improved real-time response, i.e., low latency. The invention provides a data-processing system that has optimized software, hardware, and integrated-circuit device layout.

The data-processing environment according to the invention provides an optimal overall system and, thus, improved data latency. The data-processing system includes an integrated-circuit device with a plurality of regions and a common circuitry. The plurality of regions preferably include programmable or reconfigurable electronic circuitry, for example, reconfigurable logic circuitry, or processor circuitry, embedded controller circuitry, etc. The plurality of regions may also include storage circuitry, for example, memory circuitry, latches, or flip-flops, as desired. The storage circuitry may be programmable or reconfigurable, as desired.

The plurality of regions may also include interconnect circuitry, preferably reconfigurable or programmable interconnect circuitry. The interconnect circuitry may couple the reconfigurable circuitry to other circuitry within a region and/or other parts of the integrated-circuit device, as desired.

One may program or configure the circuitry within the integrated-circuit device during initialization of the device by specifying the type of circuitry that the device will realize, the connections among those circuitries, and the outputs and inputs of those circuitries. One may also reprogram or reconfigure the integrated-circuit device during its operation, as desired. In other words, by providing configuration data to the integrated-circuit device during its operation, one may cause its re-programming or re-configuration in real time or nearly in real time. The configuration data may reside on chip or may come from an external source, as desired.

The common circuitry couples to, and provides at least one signal to, the plurality of regions of the integrated-circuit device. The common circuitry and the plurality of regions are positioned within the integrated-circuit device so as to improve the latency of the at least one signal provided to the plurality of regions of the integrated-circuit device.

Data-processing systems according to the invention use optimized software to achieve high levels of performance.

During the system design process, the designer plans the hardware implementation and architecture. The system designer then selects a particular operating system. The designer may optimize the operating system and other software, for example, application software, to fit the characteristics of the system hardware and its architecture. By optimizing the software for the hardware architecture, the system designer arrives at a system design that provides higher performance.

Another aspect of the invention provides a data-processing system with improved latency when the system executes instructions that operate on data or signals residing outside, or external to, a processor circuitry within the system. For example, the processor circuitry within the data-processing system may execute a conditional-branch instruction. The conditional-branch instruction typically requires the processor circuitry to determine the state of conditional instruction data. The conditional instruction data correspond to a signal or set of signals that the processor examines in order to execute a conditional instruction. In other words, the flow of instruction execution depends on the conditional-instruction data, and the processor circuitry makes a decision based on the conditional-instruction data.

In traditional data-processing systems, the source of the external signal or data uses an interrupt system to request service by a processor circuitry. In other words, the external source causes or initiates an interrupt to alert the processor circuitry. The processor circuitry responds by suspending its current operation (typically by saving its state and pertinent data on a stack), and then executing a routine to service the interrupt. After servicing the interrupt, the processor circuitry resumes its original task. The external source typically must wait for a relatively long time before the processor services the interrupt. Thus, the overall system exhibits considerable latency.

As an alternative to interrupt-driven systems, some data-processing systems use input registers. In those systems, a number of registers store the state of the external variables (i.e., the conditional-instruction data). The processor examines the contents of a particular register to execute a conditional instruction. Input-register systems generally provide lower latency than interrupt-driven systems. But for large designs (i.e., systems that occupy a physically large silicon area), the interconnect delay between the input signals and the processor circuitry may be large in comparison to the processor cycle time. In some applications, for example, real-time data-processing applications, the large interconnect delay may cause unacceptable or undesirable latency in the system response.

To improve response latency, data-processing systems according to the invention include fast conditional-instruction circuitry (FCIC). The FCIC circuitry improves the system's latency by providing the conditional-instruction data, which typically reside outside the processor circuitry, to a zero-page memory circuitry. The conditional-instruction data may alter the contents of one or more locations within the zero-page memory by an asynchronous-write, synchronous-read circuitry according to the invention. The source of the conditional-instruction data writes the conditional-instruction data to the zero-page memory asynchronously. The processor circuitry accesses the data by synchronously reading the contents of the zero-page memory. Thus, by using the FCIC circuitry, data-processing systems according to the invention avoid using interrupt-driven or register-input systems that typically suffer from poor latency.

FCIC circuitry according to the invention provide several advantages over conventional approaches. First, the FCIC circuitry allows a memory-mapped design approach for the system memory, thus simplifying and streamlining the design process. Second, the designer need not use any additional decoding logic to implement the memory-mapped design. Instead, the designer may use that hardware to implement other desired functionality. Third, unlike a fixed hardware implementation, the FCIC circuitry according to the invention allows changing of the software arbitration depending on the application, thus providing more design flexibility and versatility.

Real-Time Operating Environment with Improved Latency

FIG. 1 shows a data-processing system 1000 that includes an integrated-circuit (IC) circuitry 1005 and at least one peripheral circuitry 1010. The peripheral circuitries 1010 couple to the IC circuitry 1005 via signal links 1015. The IC circuitry 1005 may include an FCIC circuitry 1035 according to the invention. The IC circuitry 1005 resides within an integrated-circuit device and preferably includes one or more processor circuitries (not shown explicitly). The processor circuitry may operate on the data within the system and decode and execute instructions. The peripheral circuitries 1010 may include a variety of devices or circuits, as persons skilled in the art will recognize. For example, the peripheral circuitries 1010 may include communication or telecommunication circuitry, video circuitry, audio circuitry, input circuitry, output circuitry, storage circuitry, memory circuitry, and network circuitry, as desired.

Figure 2:
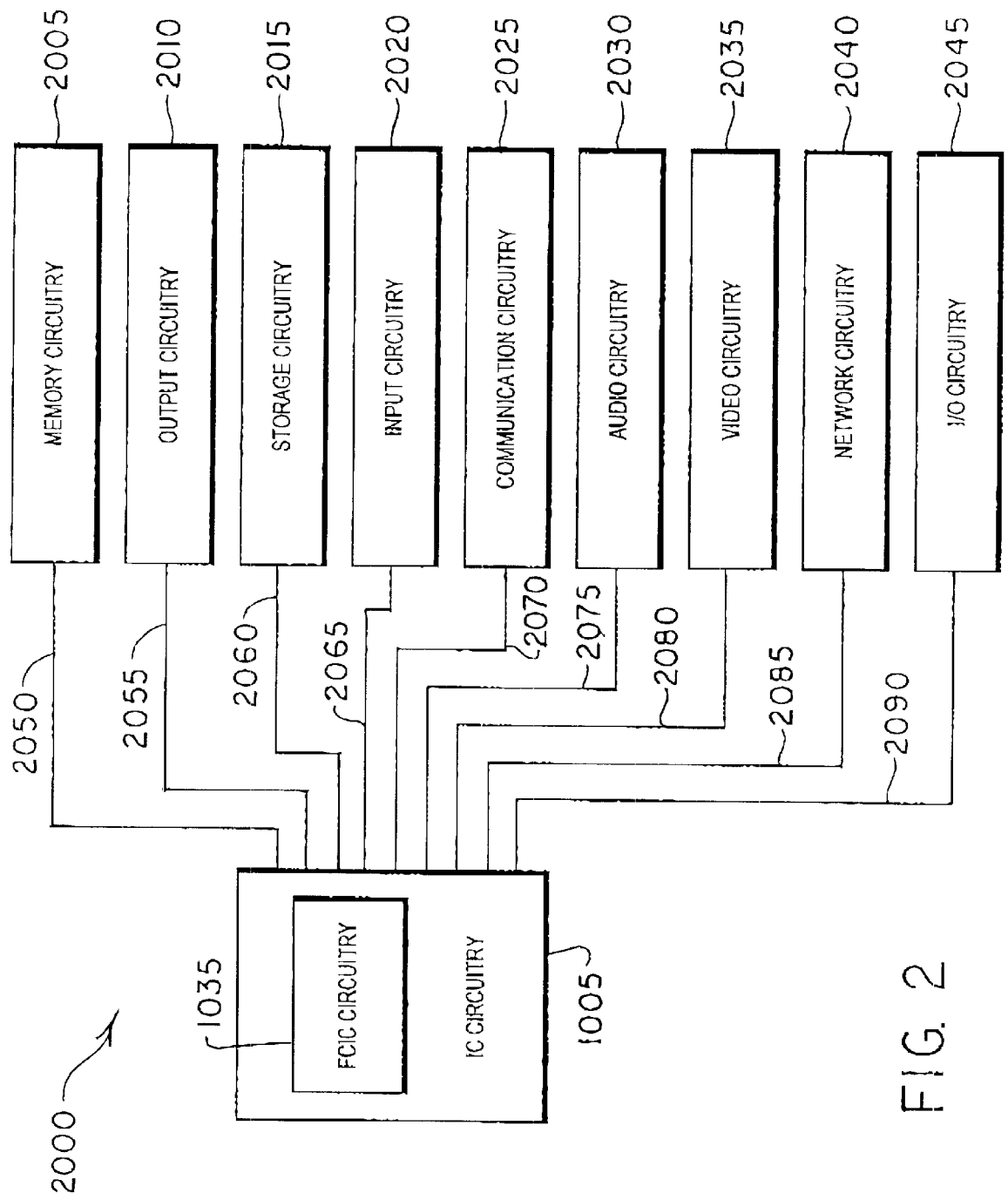
FIG. 2 shows another data-processing system that includes an integrated-circuit device according to the invention.

FIG. 2 shows another example of a system 2000 that includes an IC circuitry 1005 according to the invention. The system 2000 also includes a plurality of peripheral devices that couple to the IC circuitry 1005. The IC circuitry 1005 resides within an integrated-circuit device and preferably includes one or more processor circuitries (not shown explicitly). The processor circuitry may operate on the data within the system and decode and execute instructions. The IC circuitry 1005 may also include an FCIC circuitry 1035 according to the invention. The peripheral devices include a memory circuitry 2005 (e.g., SDRAM circuitry and associated controller), an output circuitry 2010 (e.g., a printer), a storage circuitry 2015 (e.g., a hard drive), an input circuitry 2020 (e.g., a keyboard), a communication circuitry 2025 (e.g., a modem), an audio circuitry 2030 (e.g., speakers), a video circuitry 2035 (e.g., a video controller, monitor, or both), a network circuitry 2040 (e.g., an Ethernet controller or network interface card), and I/O circuitry 2045 (e.g., game controller or joystick).

The peripheral circuitry 2005–2045 couple to the IC circuitry 1005 via signal links 2050–2090, respectively. As persons skilled in the art will recognize, however, one may use other peripheral devices and circuits, as desired. Furthermore, one may include more or fewer peripheral devices or circuits than FIG. 2 shows, as desired.

Figure 3:
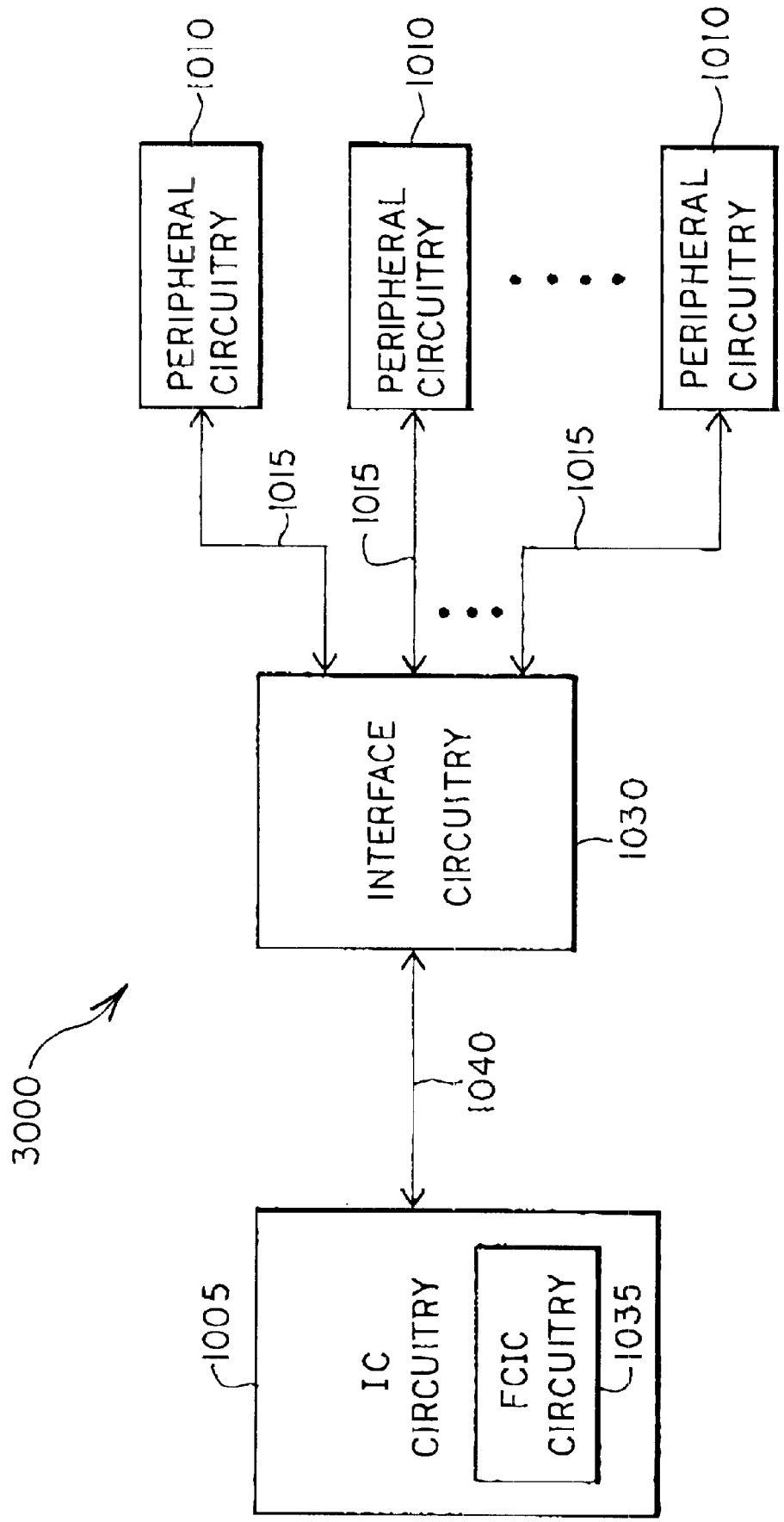
FIG. 3 illustrates a data-processing system that constitutes a variation of the system of FIG. 1.

FIG. 3 shows an alternative embodiment of a system 3000 that includes an IC circuitry 1005 according to the invention. The IC circuitry 1005 may include an FCIC circuitry 1035 according to the invention. The IC circuitry 1005 resides within an integrated-circuit device and preferably includes one or more processor circuitries (not shown explicitly). The processor circuitry may operate on the data within the system and decode and execute instructions.

The system 3000 also includes a plurality of peripheral circuitries 1010 that couple to the IC circuitry 1005 via an interface circuitry 1030. The peripheral circuitries 1010 may include a variety of devices or circuits, as persons skilled in the art will recognize. For example, the peripheral circuitries 1010 may include communication or telecommunication circuitry, video circuitry, audio circuitry, input circuitry, output circuitry, storage circuitry, memory circuitry, and network circuitry, as desired.

The peripheral circuitries 1010 couple to the interface circuitry 1030 via signal links 1015. The interface circuitry 1030 couples to the IC circuitry 1005 via a signal link 1040. Using the signal links 1015 and 1040, the interface circuitry 1030 communicates data signals, control signals, or both, between the IC circuitry 1005 and the peripheral circuitries 1010. The interface circuitry 1030 may also control the operation of the peripheral circuitries 1010, either individually, or with the supervision of the IC circuitry 1005, as desired.

Figure 4:
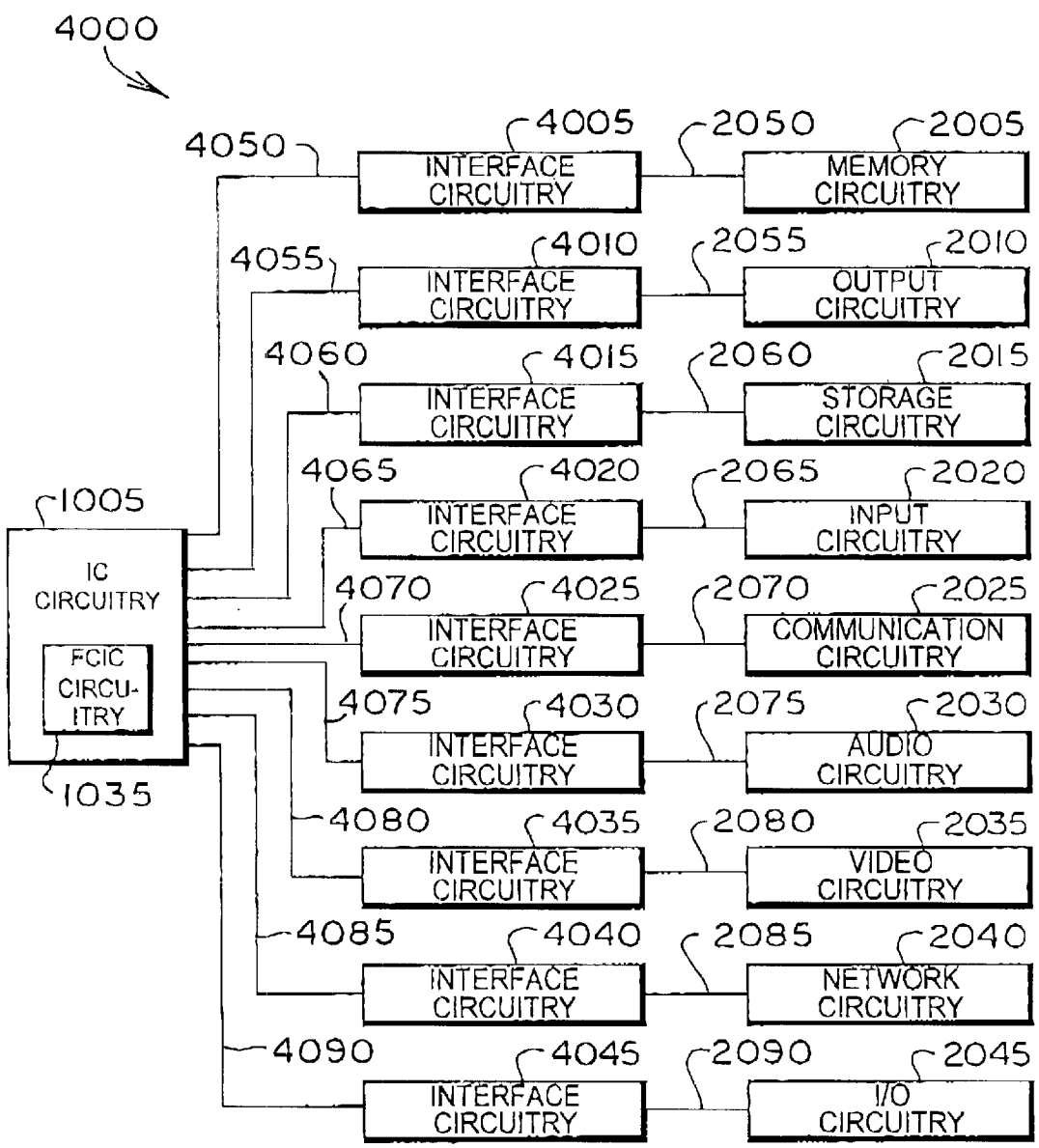
FIG. 4 shows a data-processing system that constitutes a variation of the system of FIG. 2.

FIG. 4 illustrates another alternative embodiment of a system 4000 that includes an IC circuitry 1005 according to the invention. The IC circuitry 1005 may include an FCIC circuitry 1035 according to the invention. The IC circuitry 1005 resides within an integrated-circuit device and preferably includes one or more processor circuitries (not shown explicitly). The processor circuitry may operate on the data within the system and decode and execute instructions.

The system 4000 also includes a plurality of peripheral circuitries 2005–2045 that couple to the IC circuitry 1005 via a corresponding plurality of interface circuitries 4005–4045. The peripheral devices include a memory circuitry 2005 (e.g., SDRAM circuitry and associated controller), an output circuitry 2010 (e.g., a printer), a storage circuitry 2015 (e.g. a hard drive), an input circuitry 2020 (e.g., a keyboard), a communication circuitry 2025 (e.g., a modem), an audio circuitry 2030 (e.g., speakers), a video circuitry 2035 (e.g., a video controller, monitor, or both), a network circuitry 2040 (e.g., an Ethernet controller or network interface card), and I/O circuitry 2045 (e.g., game controller or joystick). As persons skilled in the art will recognize, however, one may use other peripheral devices and circuits, as desired. Furthermore, one may include more or fewer peripheral devices or circuits than FIG. 4 shows, as desired.

Figure 5A:
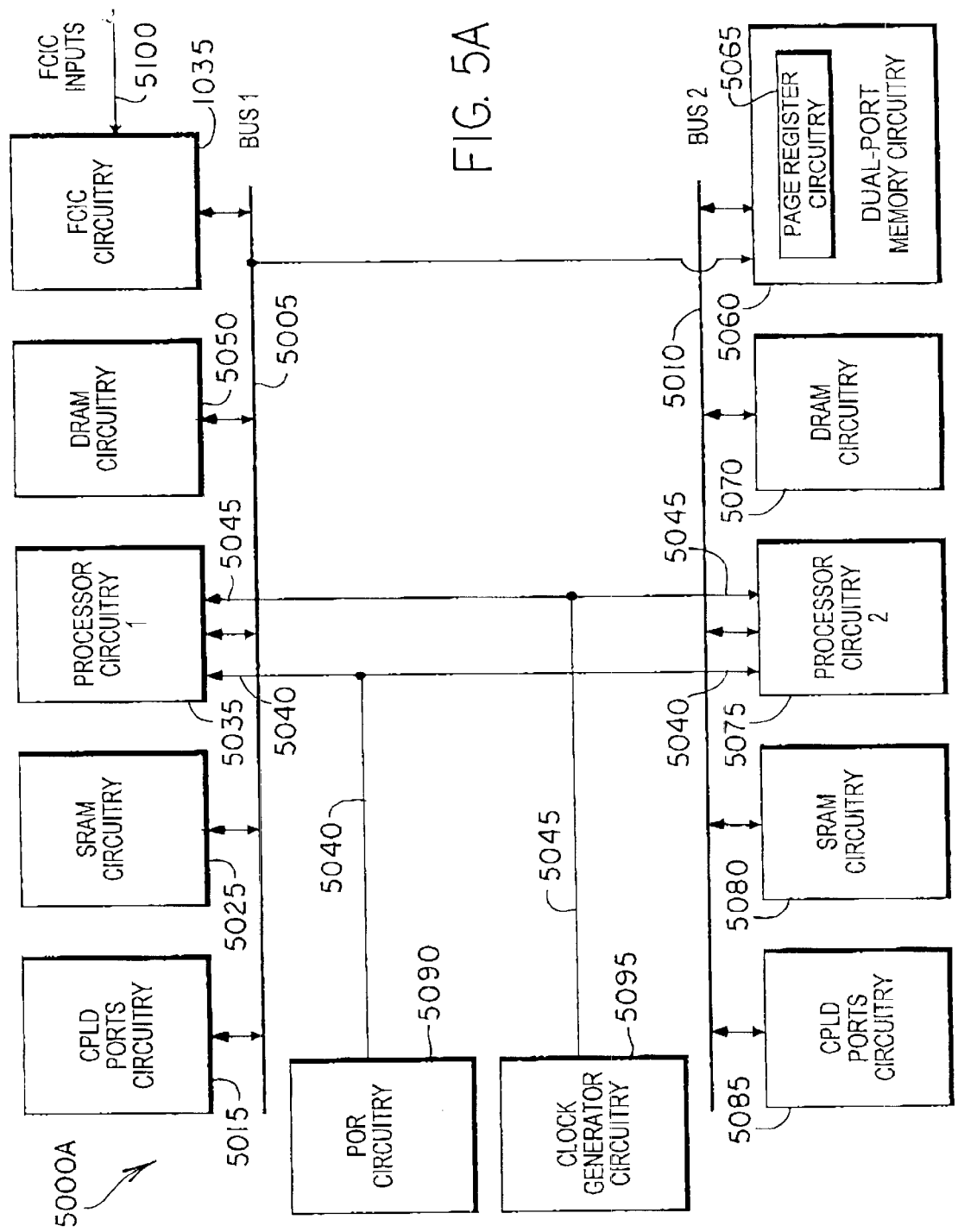
FIG. 5A illustrates a block diagram of an embodiment of a data-processing system according to the invention.

The peripheral circuitry 2005–2045 couple to the interface circuitries 4005–4045 via signal links 2050–2090, respectively. In a similar manner, the interface circuitries 4005–4045 couple to the IC circuitry 1005 via signal links 4050–4090, respectively. Using the signal links 2050–2090 and 4050–4090, the interface circuitries 4005–4045 communicate data signals, control signals, or both, between the IC circuitry 1005 and the peripheral circuitries 2005–2045. The interface circuitries 4005–4045 may also control the operation of the peripheral circuitries 2005–2045, either individually, or with the FIG. 5A depicts an embodiment 5000A of a data-processing system according to the invention. The data processing system preferably resides within a CPLD (other than external components or circuitries), although one may use other implementations, as desired, depending on system specifications. The embodiment 5000A includes a bus 5005 (labeled "Bus 1") and a bus 5010 (labeled "Bus 2"). Bus 5005 and Bus 5010 may include address signals, data signals, or both, as desired, depending on a particular system configuration. Bus 5005 couples to a processor circuitry 5035 (labeled "Processor Circuitry 1").

The processor circuitry 5035 generally constitutes a data processor, for example, a microprocessor, a microcontroller, or a digital signal-processor (DSP). Depending on a particular application, one may use other type of processors, as persons skilled in the art would understand. In a preferred embodiment, the processor circuitry 5035 constitutes a DSP, particularly a multi-threaded DSP (i.e., a DSP that can run a number of parallel processes). One may use the DSP as a real-time enhanced minimum instruction-set computer (MISC) to provide a very small core that runs at high clock rates. One may also use the DSP to execute the latency-dependent parts of the application code.

Bus 5005 also couples to CPLD ports circuitry 5015, SRAM circuitry 5025, and FCIC circuitry 1035 (described below in more detail). The FCIC circuitry 1035 accepts FCIC inputs 5100 (e.g., conditional-instruction data). The CPLD ports circuitry 5015 facilitates coupling to, and communicating with, one or more regions (e.g., quadrants) of the CPLD device in which the circuitry of FIG. 5A resides. For example, CPLD ports circuitry 5015 may include ports configured to couple to quadrants 2 and 4 of the CPLD (described below in more detail in connection with FIG. 11).

The SRAM circuitry 5025 provides high-speed static RAM to the processor circuitry 5035. If desired, bus 5005 may also couple to a DRAM circuitry 5050 that provides additional memory for the processor circuitry 5035. Note that one may use other types of memory circuitry than SRAM and DRAM, as persons skilled in the art would understand. Regardless of the type of memory, the memory circuitry or circuitries provide storage for the processor circuitry 5035.

Bus 5010 couples to a processor circuitry 5075 (labeled "Processor Circuitry 2"). The processor circuitry 5075 generally constitutes a data processor, for example, a microprocessor, a microcontroller, or a digital signal-processor (DSP). Depending on a particular application, one may use other type of processors, as persons skilled in the art would understand. In a preferred embodiment, the processor circuitry 5075 constitutes a controller/processor manufactured by Advanced RISC Machines (ARM), for example an ARM 922 processor that provides a number of single-cycle operations or instructions.

Bus 5010 also couples to CPLD ports circuitry 5085, SRAM circuitry 5080, and dual-port memory circuitry 5060. The CPLD ports circuitry 5085 facilitates coupling to, and communicating with, regions (e.g., quadrants) of the CPLD device in which the circuitry of FIG. 5A resides. For example, CPLD ports circuitry 5085 may include ports configured to couple to quadrants 1 and 3 of the CPLD (described below in more detail in connection with FIG. 11). The SRAM circuitry 5080 provides high-speed static RAM to the processor circuitry 5075. If desired, bus 5010 may also couple to a DRAM circuitry 5070 that provides additional memory for the processor circuitry 5075. Note that one may use other types of memory circuitry than SRAM and DRAM, as persons skilled in the art would understand. Regardless of the type of memory, the memory circuitry or circuitries provide storage for the processor circuitry 5075.

The dual-port memory circuitry 5060 couples to both bus 5005 and bus 5010. The dual-port memory circuitry 5060 facilitates communication, interfacing, or data interchange between the processor circuitry 5035 and the processor circuitry 5075. In other words, the processor circuitry 5035 and the processor circuitry 5075 each couple to one port of the dual-port memory circuitry 5060.

The dual-port memory circuitry 5060 includes page register circuitry 5065. The page register circuitry 5065 provides an arbitration mechanism for the processor circuitry 5035 and processor circuitry 5075. The arbitration mechanism allows the processor circuitry 5035 and the processor circuitry 5075 to use the dual-port memory circuitry 5060 without conflict. In the absence of an arbitration mechanism, the processor circuitry 5035 and the processor circuitry 5075 may both attempt to access the dual-port memory circuitry 5060 simultaneously. By doing so, the processor circuitry 5035 and the processor circuitry 5075 would potentially cause a conflict that may threaten the stability and error-free operation of the system. Using the page register circuitry 5065 helps avoid the conflict.

To further reduce the risk of conflict and contention between the processor circuitry 5035 and the processor circuitry 5075, one may use a dual-port memory circuitry 5060 that includes two memory banks. For one bank, the processor circuitry 5035 has write-only access, whereas the processor circuitry 5075 has read-only access. The converse configuration applies to the other memory bank. In other words, for the other bank, the processor circuitry 5035 has read-only access, whereas the processor circuitry 5075 has write-only access. One may then use software routines to perform arbitration between the processor circuitry 5035 and the processor circuitry 5075.

If either of the processor circuitries, say, processor circuitry 5035, wishes to access the dual-port memory circuitry 5060, it sets a flag in the page register circuitry 5065. The processor circuitry 5035 then owns the dual-port memory circuitry 5060, i.e., it may access the dual-port memory circuitry 5060. When it has finished using the dual-port memory circuitry 5060, the processor circuitry 5035 resets the flag in the page register circuitry 5065 and, thus, relinquishes control of the dual-port memory circuitry 5060. Processor circuitry 5075 may then access and use the dual-port memory circuitry 5060 by following a similar procedure.

One may use the page register circuitry 5065 to achieve logical or hierarchical partitioning of the CPLD according to the invention. The lowest level of structure corresponds to the positioning within the CPLD of the common circuitry and the plurality of regions containing configurable or programmable electronic circuitry. Another level of partitioning provides logical or hierarchical partitioning. Logical or hierarchical partitioning occurs at a higher level than does the positioning of the circuitry within the CPLD. Put another way, logical or hierarchical partitioning takes place at a more abstract level than does partitioning at the physical level.

Logical or hierarchical partitioning may further reduce system latency by providing for the use of physically aware, functional compiler designs. Traditionally, system designers have allocated various peripheral functions to the system to different areas of the system memory map. As a result, the addressing time of the memory depends on the location of particular data within the memory map, for example, when using extended addressing mode. By providing in, or confining to, each different partition a different soft instantiation of an intellectual-property (IP) macro or function, one may page each partition into the same location in the system memory map, as desired.

Logical or hierarchical partitioning can provide virtual functionality that has performance advantages in the processing of some types of algorithms, for example, polynomial-based algorithms. Furthermore, using an architectural compiler to distribute the IP functions into the different physical regions of the CPLD allows certain advantages, for example, a more structured and layered approach to System on a Programmable Chip (SOPC) architectures.

One may use the page register circuitry 5065 to implement a paged hardware mode. By using that mode, one may switch the IP functions into the zero-page memory-map, thus keeping access time to a minimum. The paged hardware mode may, for example, allow access within a single CPU cycle. One may partition the CPLD into hardware pages that one may switch onto the system buses, if desired, by writing different values into the page register circuitry 5065 and associated registers via control logic (not shown explicitly in FIG. 5A). One may achieve that result by using the page register circuitry 5065 and multiplexers (not shown explicitly in FIG. 5A) for various tiles or domains (further partitions within each of the plurality of regions of the CPLD), up to the level of a full region of the CPLD. In preferred embodiments, the multiplexer circuits perform the task of switching onto the bus or buses the data that correspond to an individual page.

The hierarchical or logical partitioning works as follows. Consider a CPLD that has N regions, where each region includes programmable or configurable electronic circuitry and cells. The memory map for the CPLD also has N sections, each section corresponding to one of the N regions. One may configure the circuitry or cells within each region with a given functionality, for example, a processor (note that one may configure or program the circuitry within each region dynamically, as desired). Thus, one may potentially have N processors running, one in each region of the CPLD.

The page register circuitry 5065 facilitates paging each region of the CPLD into the CPLD or system memory map. The memory map may constitute the actual memory map for the processor circuitry 5035 or the processor circuitry 5075, as desired. The mapping provides a way for the processor circuitries 5035 and 5075 to communicate with the regions of the CPLD through the zero-page memory circuitry (not shown explicitly in FIG. 5A) of the processor A circuitry 5035, the processor circuitry 5075, or both. By using zero-page memory circuitry, the processor circuitry 5035, the processor circuitry 5075, or both, may access the various regions of the CPLD in a shorter amount of time, thus improving response latency.

During the paging of a region of the CPLD, the contents of the bus (for example, address bus, data bus, or address/data bus, as desired) move into the zero-page memory circuitry for the processor circuitry 5035 or the processor circuitry 5075. As an example, consider a microprocessor circuitry and a buffer circuitry instantiated in, say, the second page of the page register circuitry 5065. Suppose that the microprocessor circuitry is performing some operation with the buffer circuitry. Assume further that the processor circuitry 5035 seeks to access the microprocessor circuitry. One may provide access to the microprocessor circuitry by paging appropriate data into the zero-page memory circuitry for the processor circuitry 5035. Using the paging approach does not require the microprocessor to stop or suspend its operation with the buffer circuitry; it may instead make its data available in the memory map of the processor circuitry 5035 by using the zero-page memory circuitry. The paged architecture therefore provides a fast way of exchanging data between the processor circuitry 5035 or the processor circuitry 5075 and the various regions of the CPLD.

Figure 5B:
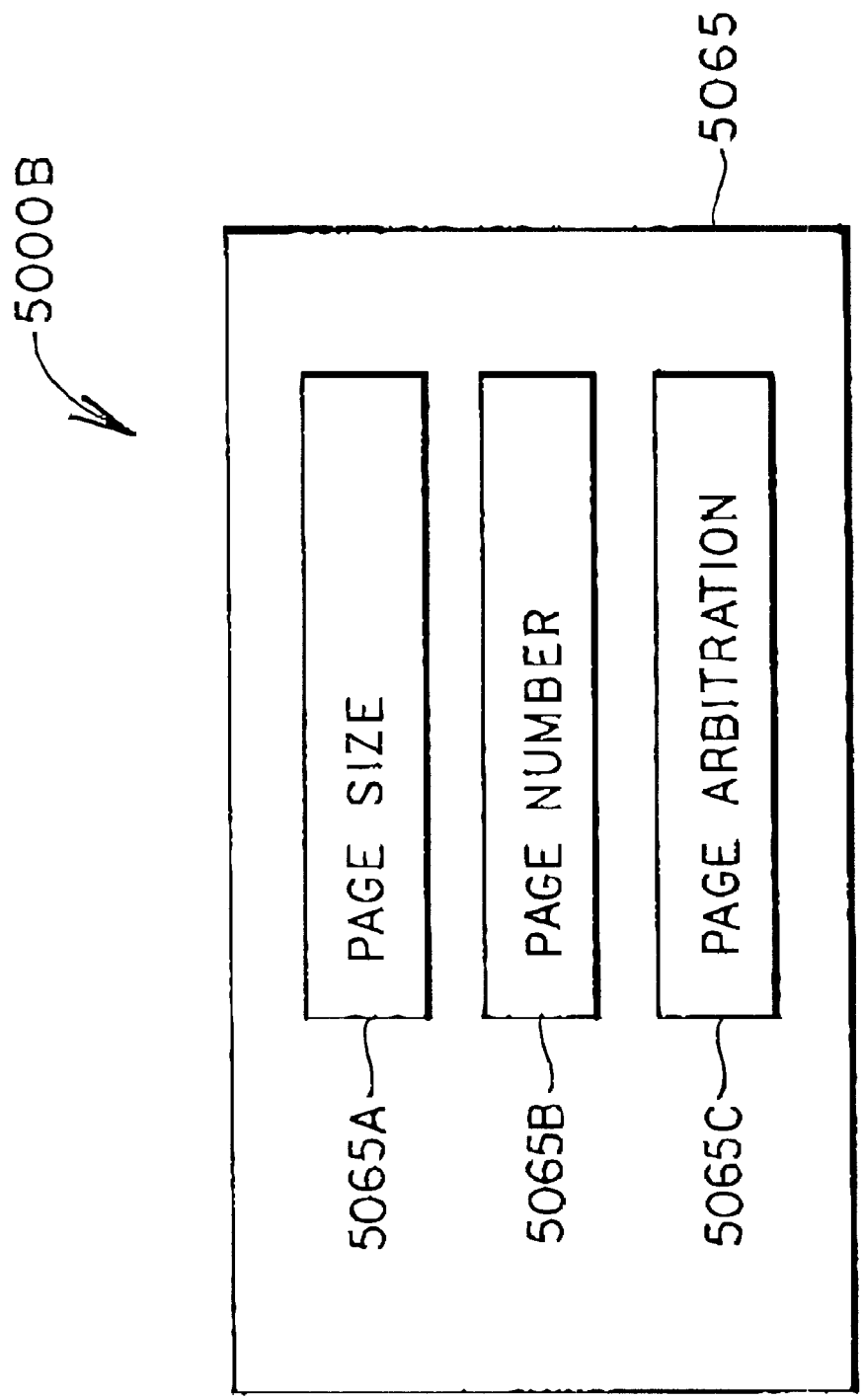
FIG. 5B depicts a block diagram of a page register circuitry according to the invention.

FIG. 5B depicts an embodiment 5000B according to the invention of the page register circuitry 5065 of FIG. 5A. Referring to FIG. 5B, the page register circuitry 5065 preferably includes three parts or fields: page size 5065A, page number 5065B, and page arbitration 5065C. Each of the parts or fields preferably includes a register. Thus, the page register circuitry 5065 preferably includes a page size register, a page number register, and a page arbitration register.

The page size 5065A signifies the amount of CPLD resources or circuitry one would use for a particular page. The page size 5065A is scalable. For example, one may specify either a large number of small-size circuitries, or a small number of large-size circuitries, or other combinations, as desired.

Figure 7:
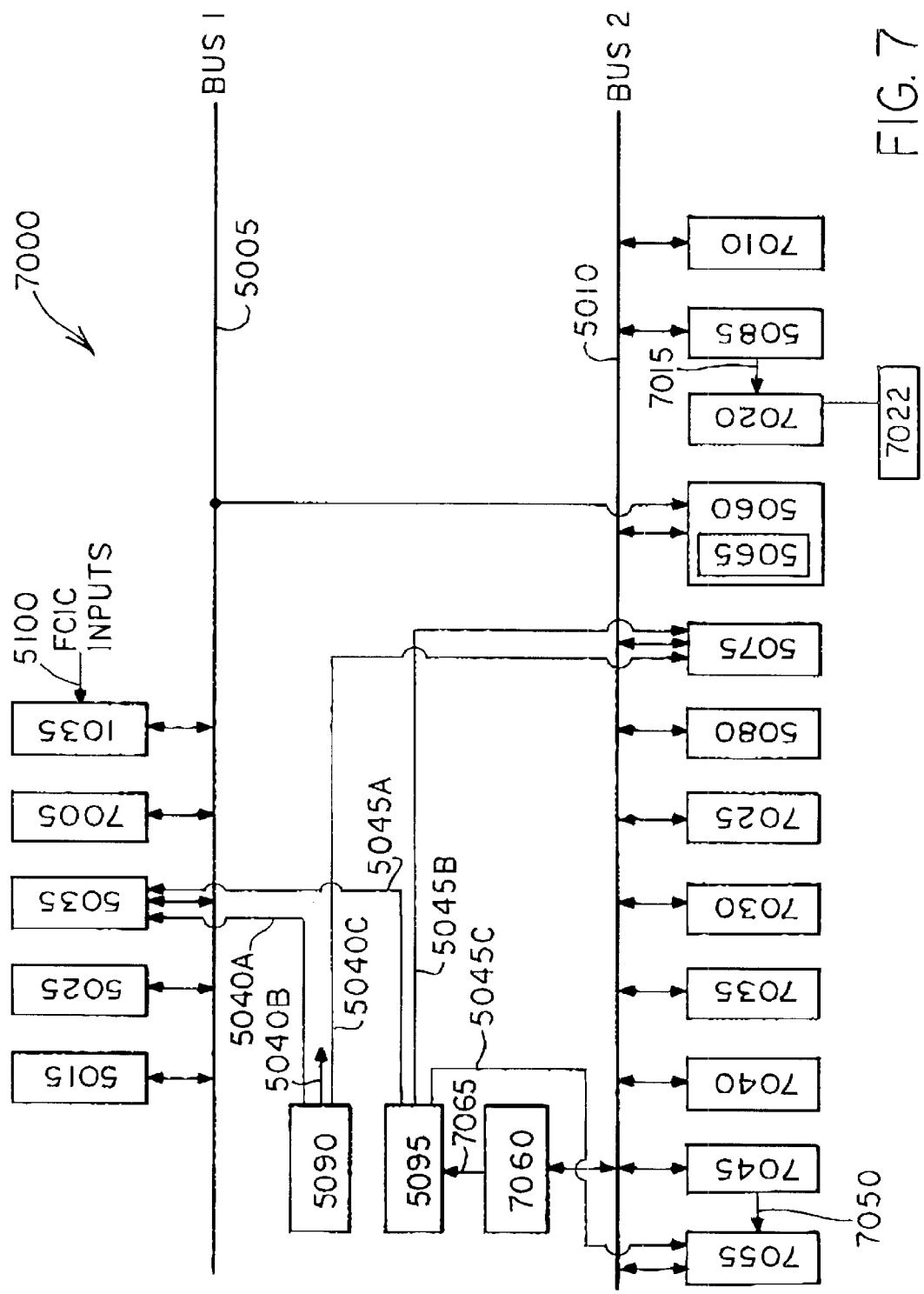
FIG. 7 depicts a more detailed block diagram of an embodiment of a data-processing system according to the invention.

The processor circuitry 5035 or the processor circuitry 5075 uses the page size 5065A to program or configure a CPLD configuration controller circuitry (not shown explicitly in FIG. 5A). The CPLD configuration controller circuitry includes a configuration memory circuitry that the processor circuitries 5035 and 5075 may configure dynamically. The configuration memory circuitry provides dynamic programming or configuration of the CPLD. One may use the page size 5065A to program the configuration memory circuitry to reserve page sizes. The description below of FIG. 7 provides more details of the CPLD configuration controller circuitry and its functionality.

Referring to FIG. 5B, the page number 5065B signifies in which address of the zero-page memory circuitry a given function will appear. In other words, the page number 5065B specifies pages in the memory map of the zero-page memory circuitry.

The page arbitration 5065C signifies the priority with which each of the hardware functions will appear in the CPLD. The page arbitration 5065C provides arbitration among the pages within the page register circuitry 5065. The page arbitration 5065C determines the order with which one loads into the zero-page memory circuitry the data that correspond to a desired function. Preferably, one programs or configures the arbitration scheme or algorithm (controlled by the page register circuitry 5065) during the initial CPLD configuration, and it remains static. Note, however, that one may dynamically re-configure the CPLD and the arbitration scheme or algorithm, as desired. The dynamic configuration of the CPLD and the arbitration scheme or algorithm may occur in real-time or in near real-time.

Logical or hierarchical partitioning in systems according to the invention provides the following advantages. First, it reduces latency because of the use of the zero-page memory circuitry. Second, it allows the paging of different concurrent functional blocks, as desired. Third, it provides for the concurrent execution of each function within its corresponding hardware page. Fourth, for identical functions, parallel configuration or instantiation by the controller of all of the functions reduces the dynamic reconfiguration time. In other words, the page size register maps each of the pages to the same memory address. Fifth, hierarchical or logical partitioning provides for parallel loading of common initial data vectors for each identical hardware function in a computation. Finally, using a number of soft functional logic instantiations, one in each page of the page register circuitry, allows implementation of a virtual stack design. Note that the above description of logical or hierarchical partitioning also applies to the embodiments shows in FIGS. 6, 7, and 8.

The system shown in FIG. 5A also includes a power-on-reset (POR) circuitry 5090. The POR circuitry 5090 provides initialization signals to the various system components upon power up. For example, the POR circuitry 5090 may provide a POR signal 5040 to the processor circuitry 5035 and the processor circuitry 5075. In response, the processor circuitry 5035 and the processor circuitry 5075 may reset their internal circuits and perform power-up functions, for example, load an initialization routine, and the like.

Note that, the POR circuitry 5090 may provide power-on-reset signals to other system components, as desired. Depending on the system design, the POR circuitry 5090 may provide more than one power-on-reset signal to the various system components, as desired. For example, the processor circuitry 5035 may have a different power-on-reset requirement than does the processor circuitry 5075. The POR circuitry 5090 may provide a POR signal to each of the processor circuitries 5035 and 5075 that meets the power-on-reset specifications of that particular processor circuitry.

The system in FIG. 5A also includes a clock generator circuitry 5095. The clock generator circuitry 5095 generates clock signals for the various systems components. For example, the clock generator circuitry 5095 may provide a clock signal 5045 to the processor circuitry 5035 and the processor circuitry 5075. Depending on the particular specifications of a given system, the clock generator circuitry 5095 may provide clock signals to other system components, as persons skilled in the art would understand. Moreover, depending on the requirements of the various system blocks, the clock generator circuitry 5095 may provide different clock signals to those blocks, as desired.

FIG. 6 shows an embodiment 6000 of a data-processing system according to the invention. The data processing system in FIG. 6 includes similar components to those in the system of FIG. 5A. Unlike the system in FIG. 5A, however, the system shown in FIG. 6 separates the buses into separate data and address/control buses. In other words, bus 5005 in FIG. 5A corresponds to data bus 6015 (labeled "Data Bus 1") and address/control bus 6005 (labeled "Address/Control Bus 1") in FIG. 6. Likewise, bus 5010 in FIG. 5A corresponds to data bus 6020 (labeled "Data Bus 2") and address/control bus 6010 (labeled "Address/Control Bus 2") in FIG. 6. Each of the data buses facilitates communication of data signals among the system components. The address/control buses, on the other hand, allow the communication of address and control signals. Otherwise, the system in FIG. 6 operates similarly to the system shown in FIG. 5A.

FIG. 7 shows an embodiment 7000 that provides a more detailed architecture of a data-processing system according to the invention. The architecture of the system in FIG. 7 generally parallels that of FIG. 5A, although with more blocks to show the flexibility of the inventive concepts and their applicability to a variety of applications.

Similar to the system of FIG. 5A, the system in FIG. 7 includes two buses: bus 5005 and bus 5010. The CPLD ports circuitry 5015, the SRAM circuitry 5025, the processor circuitry 5035, and the FCIC circuitry 1035 function similarly to their counterparts in the system of FIG. 5A. Likewise, the CPLD ports circuitry 5085, the dual-port memory circuitry 5060 (including the page register circuitry 5065), the processor circuitry 5075, and the SRAM circuitry 5080 perform functions similar to their counterparts in the system shown in FIG. 5A.

The POR circuitry 5090 provides the same general function as its counterpart in the system of FIG. 5A, albeit with some modifications. The POR circuitry 5090 has three outputs 5040A, 5040B, and 5040C. Outputs 5040A, 5040B, and 5040C provide power-on-reset signals to the processor circuitry 5035, the CPLD circuitry (the blocks shown in FIG. 7 or other circuit blocks, as desired), and the processor circuitry 5075, respectively. As noted above, the power-on-reset signals reset the respective circuitries to known initial states or causes them to perform other initialization tasks.

The clock generator circuitry 5095 also provides the same general function as its counterpart in the system of FIG. 5A, but with some modifications. The clock generator circuitry 5095 has three outputs, 5045A, 5045B, and 5045C. The outputs 5045A, 5045B, and 5045C provide clock signals to the processor circuitry 5035, the processor circuitry 5075, and an external memory circuitry 7055 (described in detail below), respectively. The outputs 5045A, 5045B, and 5045C may constitute multi-phase clock signals, as desired. The outputs 5045A, 5045B, and 5045C may provide different clocks signals, depending on the particular specifications of the processor circuitry 5035, the processor circuitry 5075, and the external memory circuitry 7055, respectively, as persons skilled in the art would understand. Thus, the clock signals may have different frequency, phase shift, or amplitude.

The clock generator circuitry 5095 may also supply clock signals to other parts of the system, as desired, depending on the specifications of a particular application. Put another way, the clock generator circuitry 5095 may supply clock signals to various parts of the system that include one or more clock domains, each with its own particular clocking requirements. The clock generator circuitry 5095 may therefore accommodate a variety of system components with differing clocking specifications.

The clock generator circuitry 5095 operates in conjunction with a phase-locked loop (PLL) circuitry 7060. The PLL circuitry 7060 provides an output 7065 to the clock generator circuitry 5095. The output 7065 may include one or more signals, depending on a particular application. As noted above, the clock signals (i.e., the outputs 5045A, 5045B, and 5045C) may have different timing, frequency, and amplitude relationships to one another. The clock generator circuitry 5095 uses the output 7065 to provide clock signals that have particular timing relationships to each other. Note that the system may include more than one PLL, as desired, depending on the specifications of a particular application. For example, each PLL may provide clock signals that satisfy the clocking requirements of one or more clock domains within the system, as noted above.

During system power-on, the PLL circuitry 7060 operates together with the POR circuitry 5090 and the clock generator circuitry 5095 to provide initial clock signals to the various system components. During the power-on reset routine, the POR circuitry 5090 programs the PLL circuitry 7060 to provide default clock signals via outputs 5045A, 5045B, and 5045C (as well as any other desired clock signals). The PLL circuitry 7060 couples to the bus 5010. Through bus 5010, the processor circuitry 5075 may program the PLL circuitry 7060 to produce other clock signals than the default clock signals. For example, through programming, the PLL circuitry 7060 may generate clock signals with different frequency, duty cycle, and the like. Note that, rather than, or in addition to, coupling to bus 5010, the PLL circuitry 7060 may couple to bus 5005, as desired. If the PLL circuitry 7060 couples to bus 5005, then the processor circuitry 5035 may program the PLL circuitry 7060. If the PLL circuitry 7060 couples to both bus 5005 and bus 5010, by using a protocol (e.g., a mechanism for arbitration and handshaking) either or both of the processor circuitry 5035 and the processor circuitry 5075 may program the PLL circuitry 7060.

The frame-buffer circuitry 7005 includes a memory circuitry that acts as a buffer for telecommunication applications. For a given application, the system's user would set up the size and the configuration of the memory to match the size and properties of the data packets or frames. Thus, the frame-buffer circuitry 7005 constitutes a scalable auxiliary memory circuitry. The memory circuitry preferably constitutes a random-access memory (RAM), but one may use other types of memory, as persons skilled in the art would understand.

The CPLD configuration controller circuitry 7010 allows either the processor circuitry 5035 or the processor circuitry 5075 to dynamically configure the CPLD circuitry. If, during the system operation, either the processor circuitry 5035 or the processor circuitry 5075 (or conceivably another system block) seeks to use a particular circuitry, it may create that circuitry dynamically. Either processor circuitry may run a program through the CPLD configuration controller circuitry 7010. The program would cause the creation or instantiation of the desired circuitry. The new circuitry would couple to the bus and become available to other system blocks. Note that the program would use available circuit blocks within the CPLD, for example, programmable logic circuitry, to create or instantiate the desired circuitry.

The Advanced Microcontroller Bus Architecture AMBA circuitry 7020 provides an interface to AMBA-compliant peripherals. AMBA is a standard bus from the Advanced RISC Machines (ARM) corporation. The system's user may use the AMBA circuitry 7020 to couple AMBA-compliant peripherals or devices 7022 (labeled "AMBA peripherals") to the system. The CPLD port circuitry 5085 provides an output or set of outputs 7015 to the AMBA circuitry 7020 to facilitate communication between circuitry within the CPLD and the AMBA-compliant peripherals. Processor circuitry 5075 may communicate with the AMBA circuitry 7020 through bus 5010 and the CPLD ports circuitry 5085. Similarly, processor circuitry 5035 may communicate with the AMBA circuitry 7020 through bus 5005, the dual-port memory circuitry 5060, bus 5010, and the CPLD ports circuitry 5085.

Note that rather than, or in addition to, the CPLD port circuitry 5085, the CPLD port circuitry 5015 may provide an output or set of outputs to the AMBA circuitry 7020, as desired. Note also that the AMBA standard constitutes only one of a number of bus standards available. The user may use the circuitry 7020 to interface to other types of buses by making modifications that are within the knowledge of a person of ordinary skill in the art.

The Media-Access Control (MAC) circuitry 7025 allows the system to communicate with a network. For example, the user may couple the system or the CPLD to, say, the Internet, through an Ethernet or other type of network, by using the MAC circuitry 7025. Note that the MAC circuitry 7025 may allow the system or the CPLD to communicate with a wide variety of networks, for example, Ethernet networks, token-ring networks, and the like, as desired.

The Universal Asynchronous Receiver-Transmitter (UART) circuitry 7030 provides a mechanism for the CPLD or the system to couple to a general-purpose or special-purpose serial port or serial device. The UART circuitry 7030 may support a wide variety of serial-communication interfaces, as desired, and depending on the specifications of a particular application. The UART circuitry 7030 allows serial communication with the system or the CPLD in a variety of situations. For example, the system's user may use the UART circuitry 7030 to connect a data terminal to the system or the CPLD. Likewise, the user may use the UART circuitry 7030 to communicate with the system or the CPLD. As another example, the UART circuitry 7030 may facilitate serial communication with a computer or data-processing system through the telephone lines.

The external flash-memory circuitry 7035 allows a user to store a system or CPLD configuration for future use. The user may store the configuration and access it periodically to initialize the system, the CPLD, or both, at the time of powering up the system, or at other times, as desired. The configuration may include the programming for the programmable circuitry within the CPLD or other parts of the system. The user may modify the configuration as needed or desired. For example, after the initial configuration, the user may dynamically modify or update the configuration. Note that, rather than using flash memory, one may employ other types of memory, for example, read-only memory (ROM) programmable read-only memory (PROM), electrically-erasable programmable read-only memory (EEPROM), and the like. In applications where the user does not need to modify the configuration after the initial system configuration, the user may use a read-only type of memory, as desired.

The external memory circuitry 7055 provides the system's main memory. Although the CPLD includes some memory, some applications may require a larger amount of memory. The external memory circuitry 7055 provides the additional memory capacity for those applications. The external memory circuitry 7055 may use a variety of memory circuits, for example, dynamic random-access memory (DRAM), synchronous dynamic random-access memory (SDRAM), flash memory, and the like, as persons skilled in the art would understand.

The memory-controller circuitry 7045 provides a means of controlling the functions of the external memory circuitry 7055. The memory controller circuitry 7045 couples to the external memory circuitry 7055 through an interface 7050. The interface 7050 includes one or more signal lines that allow the memory controller circuitry 7045 to control the functions of the external memory circuitry 7055. Generally, the processor circuitry 5035, the processor circuitry 7075, or both, communicate with the memory controller circuitry 7045. Rather than, or in addition to, the processor circuitries 5035 and 5075, other devices within the system or the CPLD may communicate with the memory controller circuitry 7045, as desired.

The skew phase adjust circuitry 7040 provides more precise control of the timing of the operation of the external memory circuitry 7055 and other high-speed system blocks. The high-speed system blocks typically require finer adjustments to their timing for them to operate at optimum operating points. The skew phase adjust circuitry 7040 provides for electronic adjustment of the timing of high-speed system blocks. For example, the skew phase adjust circuitry 7040 may allow more precise phase adjustment of the clock signal or signals for the external memory circuitry 7055.

The system blocks described here provide the system's user a high degree of flexibility in configuring the system's architecture and operations. Note that, depending on a particular application, the system may not include all of the described blocks. Based on the a particular application's specifications, the system's user may include the components that provide the required functionality but choose not to include other system blocks and components.

Figure 8:
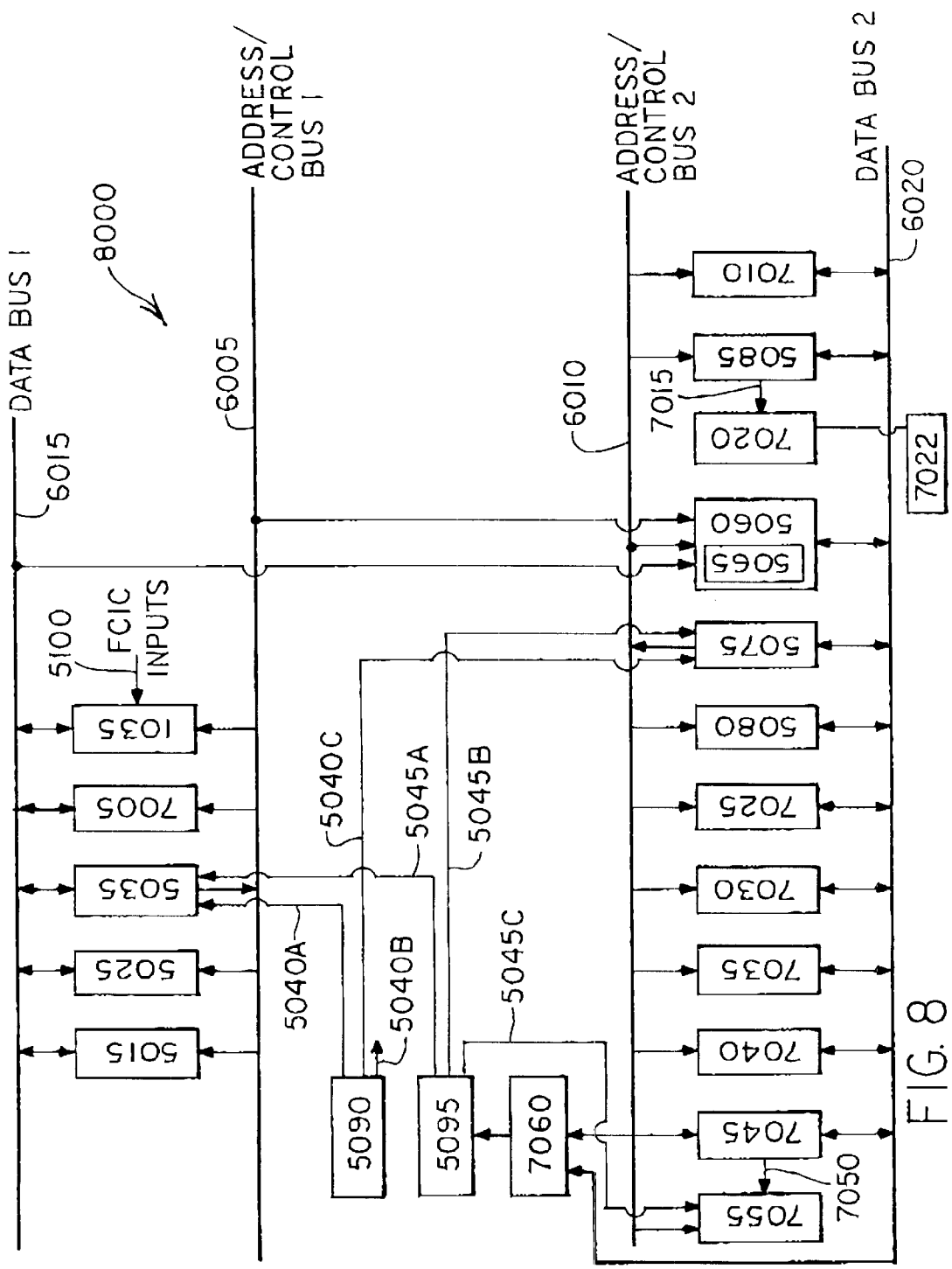
FIG. 8 illustrates a more detailed block diagram of another embodiment of a data-processing system according to the invention.

FIG. 8 shows an alternative embodiment 8000 that provides a more detailed architecture of a data-processing system according to the invention. The data processing system in FIG. 8 includes similar components to those in the system of FIG. 7. Unlike the system in FIG. 7, however, the system shown in FIG. 8 separates the buses into separate data and address/control buses. In other words, bus 5005 in FIG. 7 corresponds to data bus 6015 (labeled "Data Bus 1") and address/control bus 6005 (labeled "Address/Control Bus 1") in FIG. 8. Likewise, bus 5010 in FIG. 7 corresponds to data bus 6020 (labeled "Data Bus 2") and address/control bus 6010 (labeled "Address/Control Bus 2") in FIG. 8. Each of the data buses 6015 and 6020 facilitates the communication of data signals among the system components. The address/control buses 6005 and 6010, on the other hand, allow the communication of address and control signals. The remaining blocks in FIG. 8 operate in a manner similar to the blocks described in connection with FIG. 7.

FIGS. 5–8 show CPLD architectures that provide hardware for high-performance data-processing systems according to the invention. As noted above, optimal performance of data processing systems according to the invention also depends on optimum layout of the circuitry on the silicon substrate. Thus, another aspect of the invention relates to optimal silicon-layout of the CPLD.

Data-processing systems according to the invention include an integrated-circuit device with a plurality of regions and a common circuitry. The common circuitry couples to, and provides at least one signal to, the plurality of regions of the integrated-circuit device. The layout of the integrated-circuit device, e.g., a CPLD, according to the invention positions the plurality of regions and the common circuitry within the integrated-circuit device so as to improve the latency of the signal or signals provided to the plurality of regions.

Figure 9A:
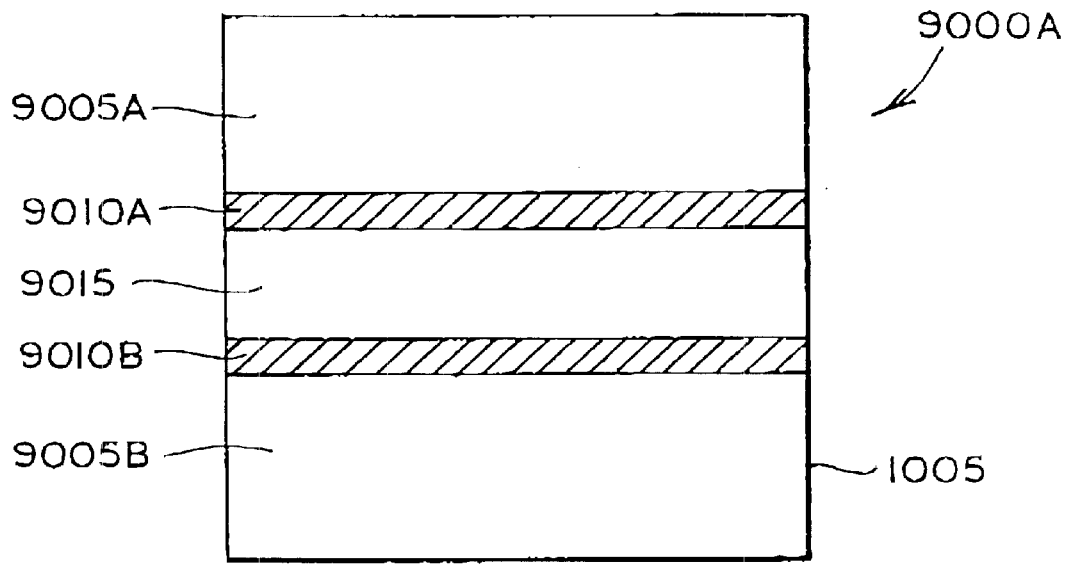
FIG. 9A shows an embodiment of an integrated-circuit device layout according to the invention.
Figure 9B:
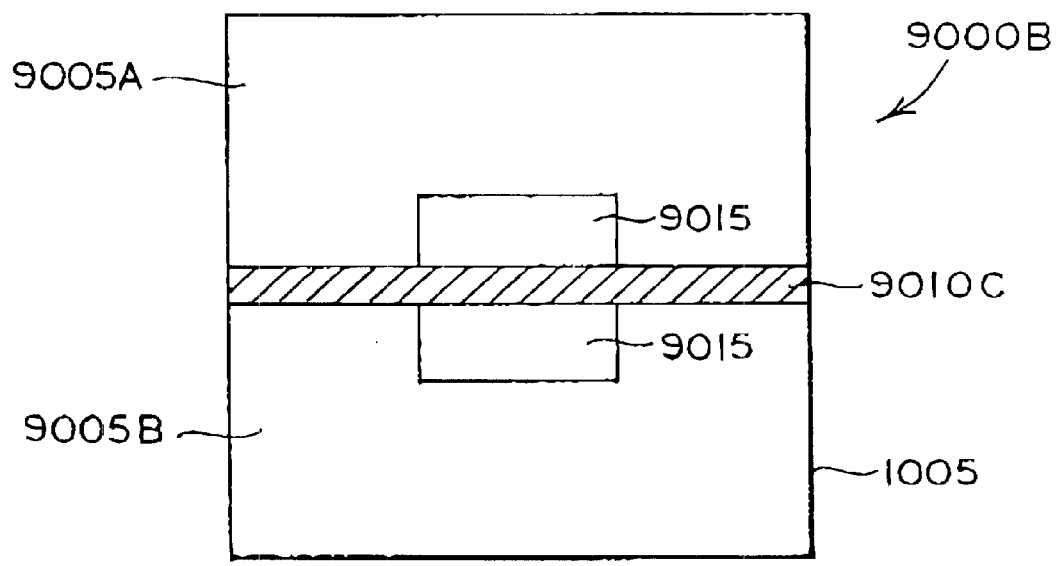
FIG. 9B depicts a second embodiment of an integrated-circuit device layout according to the invention.

FIGS. 9–10 provide exemplary embodiments of the silicon-layout according to the invention. Each of FIGS. 9A–9B and 10A–10D shows an integrated-circuit device 1005 that includes one or more blocks of common circuitry 9015 and one or more buses or signal distribution circuitries 9010. The common circuitry 9015 includes electronic circuitry, for example, processor circuitry and memory circuitry, that operate at high speed. The integrated-circuit device 1005 also includes a plurality of regions 9005. The regions 9005 include electronic circuitry, for example, logic circuitry and data-processing circuitry. Preferably, the regions 9005 constitute programmable or reconfigurable circuitry, for example, the programmable circuitry available within a CPLD or FPGA.

The common circuitry 9015 communicates signals to the regions 9005 via the buses 9010. The buses 9010 may include a wide variety of signals, as desired. For example, the buses 9010 may include clock signals, control signals, status signals, data signals, address signals, and the like. The buses 9010 may also route logic signals to the various parts or regions of the integrated-circuit device 1005, as desired.

In an integrated-circuit device according to the invention, the common circuitry 9015 is positioned relative to the regions 9005 so as to improve the latencies of the signals that the common circuitry 9015 communicates to the regions 9005. Generally, the common circuitry 9015 has substantially the same physical distance to the regions 9005. By way of illustration, the common circuitry may reside physically within the central area of the integrated-circuit device 1005, with the regions 9005 arranged around the common circuitry 9015. As another illustration, the common circuitry 9015 may reside substantially centrally within the area between at least two of the regions 9005.

Placing the common circuitry 9015 so that it has substantially the same distance from the regions 9005 helps to avoid long physical lengths of the signal lines within the buses 9010. Thus, laying out the integrated-circuit device 1005 according to the invention improves the latencies of the signals within the buses 9010 to each of the plurality of the regions 9005. Moreover, laying out the integrated-circuit device 1005 according to the invention tends to equalize the latency of the signal or signals that the common circuitry 9015 provides to each of the plurality of the regions within the integrated-circuit device 1005.

FIGS. 9A and 9B illustrate integrated-circuit devices 1005 that have a bus or buses 9010 that run only in one direction within the integrated-circuit device 1005. For example, the bus or buses 9010 may run vertically or horizontally along the integrated-circuit device 1005. FIG. 9A shows an embodiment 9000A of an integrated circuit device 1005 according to the invention that has a common circuitry 9015 and buses 9010A and 9010B. The buses 9010A and 9010B generally run horizontally along the integrated-circuit device 1005. The integrated-circuit device 1005 also includes regions 9005A and 9005B. The region 9005B neighbors the bus 9010B, whereas the region 9005A neighbors the bus 9010A.

FIG. 9B shows an alternative embodiment 9000B of an integrated circuit device 1005 according to the invention. The integrated-circuit device 1005 includes a common circuitry 9015, and a bus 9010C. The integrated-circuit circuitry 1005 also has regions 9005A and 9005B. The common circuitry 9015 generally resides within the central area of the integrated-circuit device 1005. The bus 9010C runs through the common circuitry 9015.

FIGS. 10A–10D illustrate integrated-circuit devices 1005 that include buses 9010. The buses 9010 run in two directions within the integrated-circuit device 1005. For example, one bus may run horizontally, whereas a second bus may run vertically. As another example, a single bus may have segments or sections that run both horizontally and vertically within the integrated-circuit device 1005.

Figure 10A:
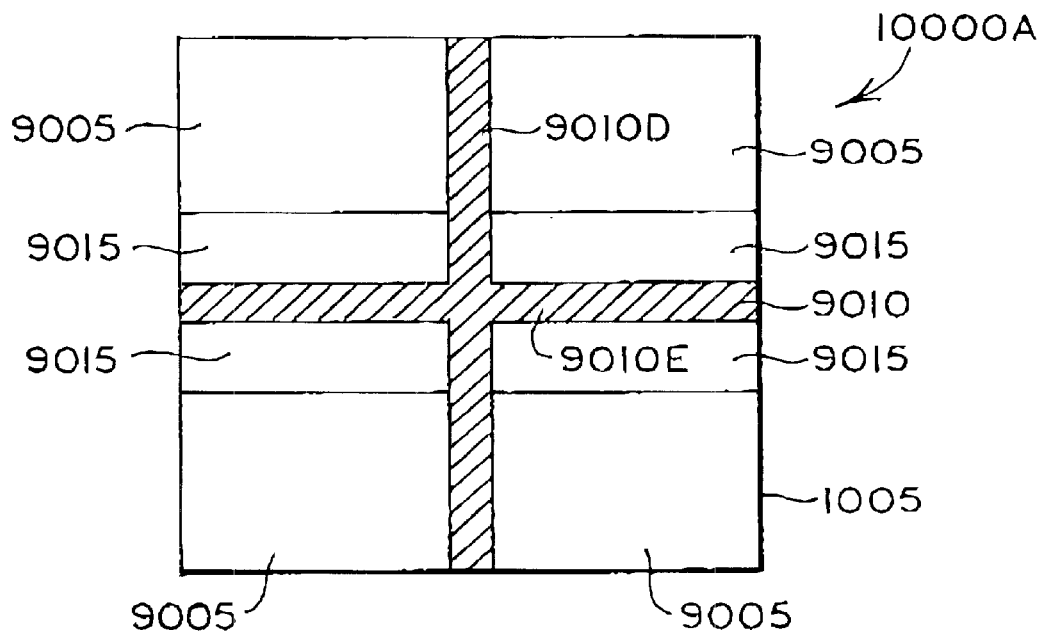
FIG. 10A illustrates a third embodiment of an integrated-circuit device layout according to the invention.

FIG. 10A shows a preferred embodiment 10000A of an integrated-circuit device 1005 according to the invention. The integrated-circuit device 1005 has a common circuitry 9015 and a plurality of regions 9005. The integrated-circuit device 1005 also includes a bus 9010, which generally has the shape of a plus sign ("+"). The bus 9010 has a vertical segment 9010D and a horizontal segment 9010E. The bus 9010 generally resides within the central area of the if common circuitry 9015 and runs through it, i.e., overlaps at least part of it.

Figure 10B:
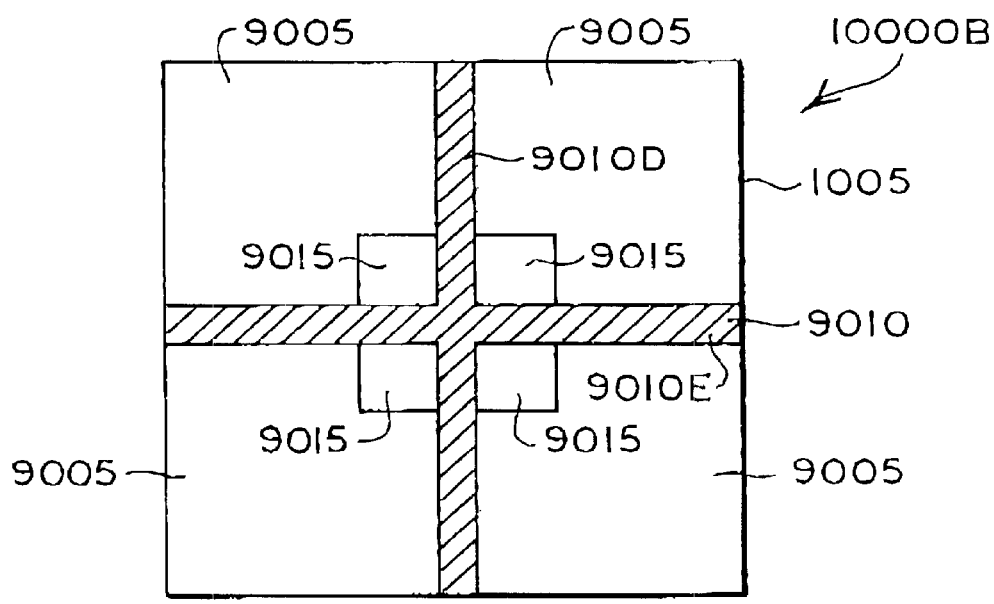
FIG. 10B shows a fourth embodiment of an integrated-circuit device layout according to the invention.

FIG. 10B shows another embodiment 10000B of an integrated-circuit device 1005 according to the invention. The integrated-circuit device 1005 has a common circuitry 9015 and a plurality of regions 9005. The common circuitry 9015, unlike the common circuitry 9015 of embodiment 10000A in FIG. 10A, does not extend to the edges of the integrated-circuit device 1005. The integrated-circuit device 1005 also includes a bus 9010, which generally has the shape of a plus sign ("+"). The bus 9010 has a vertical segment 9010D and a horizontal segment 9010E. The bus 9010 generally resides within the central area of the common circuitry 9015 and runs through it, i.e., overlaps at least part of it.

Figure 10C:
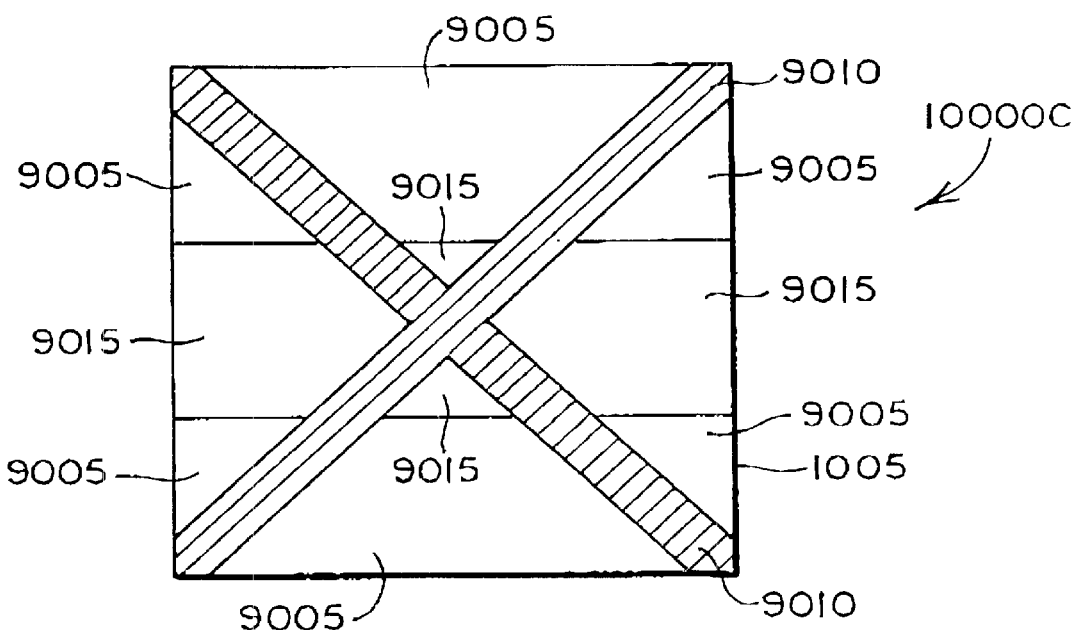
FIG. 10C depicts a fifth embodiment of an integrated-circuit device layout according to the invention.
Figure 10D:
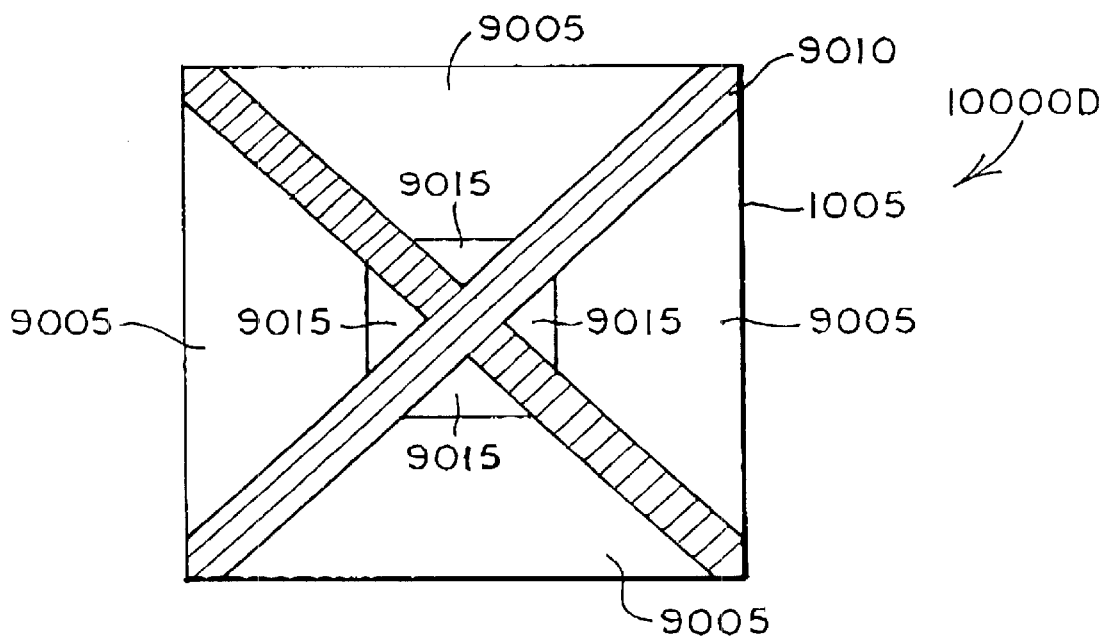
FIG. 10D illustrates a sixth embodiment of an integrated-circuit device layout according to the invention.

FIGS. 10C and 10D illustrate embodiments 1000C and 1000D, respectively, of an integrated-circuit device 1005 according to the invention. The embodiment 10000C is similar to the embodiment 10000A in FIG. 10A, but the bus 9010 has the shape of a cross, rather than a plus sign. Likewise, the embodiment 10000D is similar to the embodiment 10000B in FIG. 10B, but the bus 9010 has the shape of a cross, rather than a plus sign.

Figure 11:
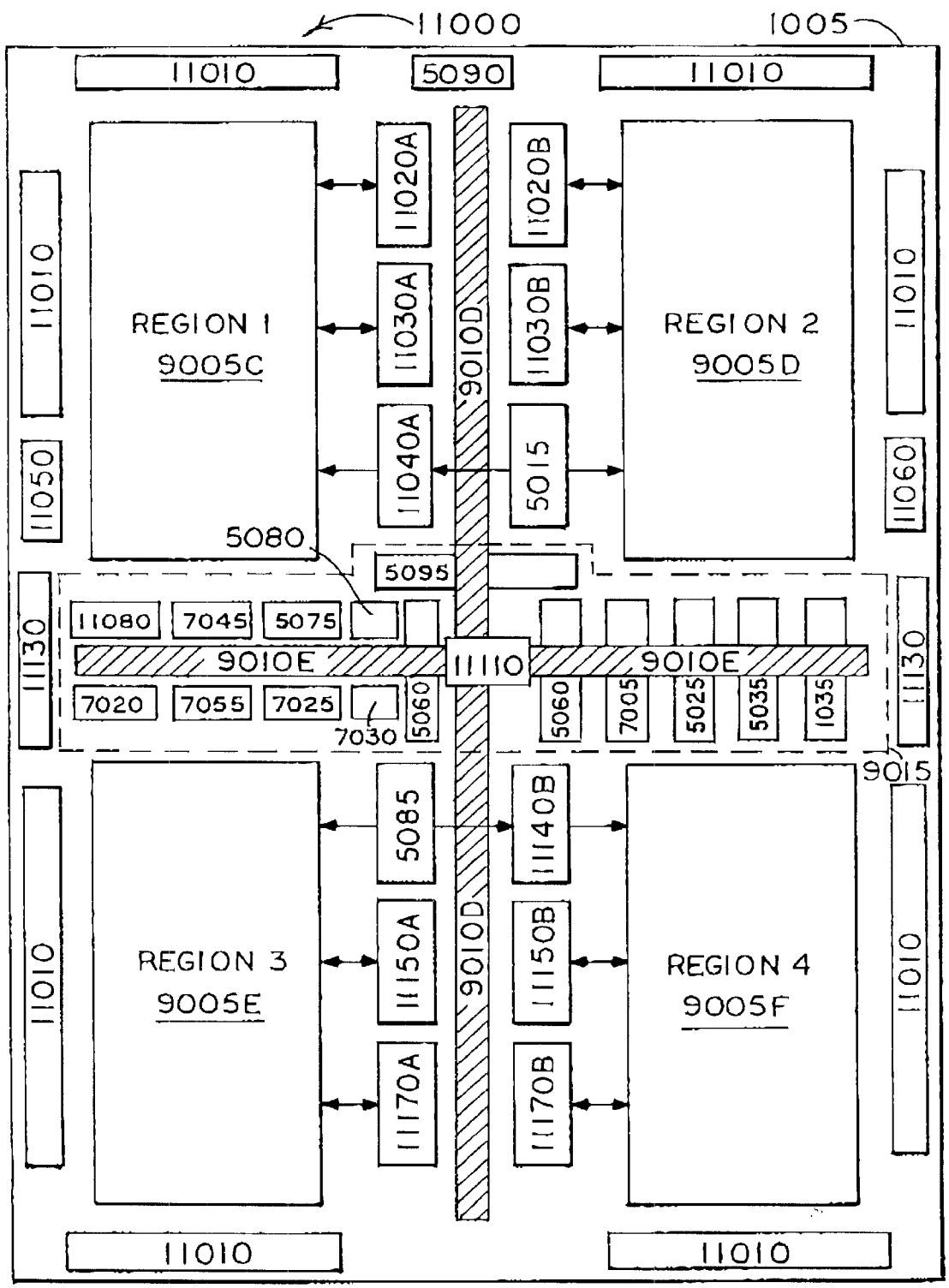
FIG. 11 shows a more detailed block diagram of an integrated-circuit device layout according to the invention.

FIG. 11 illustrates a preferred embodiment 11000 of an integrated-circuit device 1005 according to the invention. The layout of the integrated-circuit device 1005 corresponds generally to that shown in FIG. 10A. Note, however, that one may lay out the integrated-circuit device 1005 in FIG. 11 in other ways, for example, as shown in FIGS. 9 and 10, as desired.

The embodiment 11000 includes common circuitry 9015 generally positioned in the central part of the integrated-circuit device 1005. In the preferred embodiment shown in FIG. 11, the common circuitry 9015 includes ETM circuitry 11080, AMBA circuitry 7020, memory controller circuitry 7045, external memory circuitry 7055, processor circuitries 5035 and 5075, MAC circuitry 7025, SRAM circuitries 5025 and 5080, UART circuitry 7030, dual-port memory circuitries 5060, buffer circuitry 11110, frame buffer circuitry 7005, FCIC circuitry 1035, and clock generator circuitry 5095. Note, however, that the common circuitry 9015 may include more or fewer blocks of circuitry, as desired. Note also that the common circuitry 9015 may include different blocks of circuitry than those shown in FIG. 11, as persons of ordinary skill in the art who have the benefit of this description of the invention would understand.

The description of FIGS. 5–8 above includes descriptions of some of the blocks within the integrated-circuit device 1005 shown in FIG. 11. Those blocks include the clock generator circuitry 5095, the processor circuitry 5035 (and the associated PLL circuitry 7060 and skew phase adjust circuitry 7040, which FIG. 11 does not show explicitly), the SRAM circuitry 5020, the AMBA circuitry 7020, the external-memory circuitry 7055, the memory-controller circuitry 7045, the MAC circuitry 7025, the UART circuitry 7030, the frame-buffer circuitry 7005, the SRAM circuitry 5025, the processor circuitry 5075, the FCIC circuitry 1035, the dual-port memory circuitry 5060 (and the associated page-register circuitry 5065, which FIG. 11 does not show explicitly). FIG. 11 shows the dual-port memory circuitry 5060 as two blocks, one on either side of the bus 9010D. The two blocks constitute an electrically contiguous dual-port memory circuitry 5060, even though, they are physically non-contiguous (i.e., they reside on opposite sides of bus 9010D).

The integrated-circuit device 1005 includes buses 9010D and 9010E. Bus 9010D has a generally vertical orientation, whereas bus 9010E has a generally horizontal orientation. Note that buses 9010D and 9010E intercept generally in the central area of the integrated-circuit device 1005. A buffer circuitry 11110 resides at or near the intersection of bus 9010D and bus 9010E. The buffer circuitry 11110 acts as an amplifier, buffer, or both, for the signals traveling along buses 9010D and 9010E. Because the buses 9010D and 9010E travel nearly from one side of the integrated-circuit device 1005 to its opposite side, the buffer circuitry 11110 helps to prevent the signal degradation that may otherwise occur because of long signal lines. The buffer circuitry 11110 may amplify, buffer, and/or reshape signals on each of the buses 9010D and 9010E, or segments of buses 9010D and 9010E.

As FIG. 11 shows, the integrated-circuit device 1005 includes four regions 9005C–9005F, labeled "Region 1" through "Region 4." Those regions include electronic circuitry, preferably programmable or reconfigurable circuitry of the type commonly used in PLDs, CPLDs, and FPGAS. The common circuitry within the integrated-circuit device 1005 provides signals to each of the regions 9005C–9005F via buses 9010D and 9010E. Because of the generally central location of the common circuitry within the integrated-circuit device 1005, the latencies of the signals that the common circuitry provides to the regions 9005C–9005F are improved.

Note also that in the embodiment 11000, the buses 9010D and 9010E run in a symmetrical manner with respect to the regions 9005C–9005F. Because of the layout of the buses 9010D and 9010E and given that the common circuitry generally resides within the central part of the integrated-circuit device 1005, the signals that the common circuitry provides to each of the regions 9005C–9005F tend to experience the same amount of latency. Put another way, if one randomly distributes signals from the common circuitry across the integrated-circuit device 1005, its overall performance may suffer because the signals may reach different regions 9005C–9005F with different latencies. Placing the common circuitry and the buffer circuitry 11110 generally in the central part of the integrated circuit device 1005 tends to allow buses 9010E to distribute signals from the common circuitry with equal latencies.

Regions 9005C–9005F (labeled "Region 1" through "Region 4" in FIG. 11) may need additional storage or memory during their operation. Memory circuitries 11020A and 11020B provide additional storage to the circuitry within regions 9005C and 9005D, respectively. Similarly, memory circuitries 11070A and 11070B provide additional storage to the circuitry within regions 9005E and 9005F, respectively.

Dual-port memory circuitries 11030A–11030B and 11150A–11150B facilitate the exchange of data and other signals among the regions 9005C–9005F. Dual-port memory circuitries 11030A–11030B and 11150A–11150B preferably constitute SRAM memory, which can operate at relatively high speeds. Dual-port memory circuitries 11030A and 11030B are electrically contiguous, but physically separate (i.e., laid out in non-contiguous parts of the integrated-circuit device 1005), memory circuits. Regions 9005C and 9005D may access dual-port memory circuitries 11030A and 11030B simultaneously and exchange data and signals through them. In other words, bus 9010D runs through (overlaps with) the dual-port memory circuitry that includes dual-port memory circuitries 11030A and 11030B.

Similarly, dual-port memory circuitries 11150A and 11150B constitute electrically contiguous, but physically separate (i.e., laid out in non-contiguous parts of the integrated-circuit device 1005), memory circuits. Put another way, bus 9010D runs through (overlaps with) the dual-port memory circuitry that includes dual-port memory circuitries 11150A and 11150B. Regions 9005E and 9005F may both access dual-port memory circuitries 11150A and 11150B at the same time and exchange data and signals through them.

Note that, if desired, dual-port memory circuitries 11030A, 11030B, 11150A, and 11150B may constitute an electrically contiguous, yet physically non-contiguous memory circuit. Configuring the dual-port memory circuitries 11030A, 11030B, 11150A, and 11150B as an electrically contiguous memory circuit offers additional flexibility by providing a mechanism for the regions 9005C–9005F to communicate with one another. Configuring the dual-port memory circuitries 11030A, 11030B, 11150A, and 11150B as an electrically contiguous memory circuitry, however, may result in longer signal propagation times. Thus, depending on the specifications of a given application, one may organize the dual-port memory circuitry 11030A, 11030B, 11150A, and 11150B so as to trade off flexibility and performance, as persons of ordinary skill in the art would understand.

CPLD ports circuitries 5015 and 5085 facilitate communication and exchange of data and signals among the regions 9005C–9005F. The CPLD ports circuitries 5015 and 5085 couple to the bus 9010D, bus 9010E, or both, as desired (FIG. 11 does not explicitly show the coupling mechanisms). The CPLD ports circuitry 5015 interacts with the region 9005D directly. The CPLD ports circuitry 5015, however, interacts with the region 9005C through the multiplexer (MUX) circuitry 11040A. Similarly, the CPLD ports circuitry 5085 interacts with the region 9005E directly. In contrast, the CPLD ports circuitry 5085 interacts with the region 9005F through the MUX circuitry 11140B.

The MUX circuitries 11040A and 11140B provide more flexibility by, for example, facilitating interaction with selected blocks or parts of regions 9005C and 9005F, respectively. Note, however, that the CPLD ports circuitries 5015 and 5085 may interact directly with the regions 9005C–9005D and 9005E–9005F, respectively, as desired. As yet another alternative, the CPLD ports circuitries 5015 and 5085 may interact through MUX circuitries with each of the regions 9005C–9005D and 9005E–9005F, respectively, as desired.

The integrated-circuit device 1005 in FIG. 11 includes circuitry that facilitate debugging and tracing of the operation and timing of the CPLD logic circuitry. An embedded trace macro-cell (ETM) circuitry 11080 monitors the state of the processor circuitry 5035, the processor circuitry 5075, or both, as desired. The ETM circuitry 11080 receives signals from the monitored block (e.g., the processor circuitry 5035, the processor circuitry 5075, or both) and id provides tracing and debugging information to a soft ETM circuitry 11050.

The soft ETM circuitry 11050 provides the remainder of the circuitry for performing the trace or debug operation. The soft ETM circuitry 11050, operating in conjunction with the ETM circuitry 11080, obviates the need for including tracing and debugging hardware within the monitored circuitry, thus saving cost and silicon area. The soft ETM circuitry 11050 allows the user of the integrated-circuit device 1005 to debug the circuitry that the user plans to include within the integrated-device 1005. The user may use a terminal or computer with appropriate tracing and debugging software to facilitate that task. Once the user has debugged the circuitry, the user may eliminate from the integrated-circuit device 1005 the soft ETM circuitry 11050, the ETM circuitry 11080, or both, to further save cost and silicon area.

A low-voltage differential signaling (LVDS) circuitry 11060 provides a mechanism for the integrated-circuit device 1005 to communicate with other systems, devices, or circuits that contain a similar LVDS circuitry 11060. The LVDS circuitry 11060 provides a serial interface to facilitate communication and exchange of data or signals with other devices. The LVDS circuitry 11060 preferably resides in relative close proximity to the common circuitry (e.g., the processor circuitry 5035 and the SRAM circuitry 5025) so that it may provide high-speed signals or data from the common circuitry to other systems, devices, or circuits. Relative close proximity to the common circuitry also allows the LVDS circuitry 11060 to supply signals from other system, devices, or circuits to the common circuitry with improved latency.

The integrated-circuit device 1005 includes a plurality of input/output (I/O) circuitries 11010 and dedicated I/O circuitries 11130. The I/O circuitries 11010 and the dedicated I/O circuitries 11130 generally reside near the peripheries of the integrated-circuit device 1005. The I/O circuitries 11010 provides a means for the circuitry within the integrated-circuit device 1005 to communicate with off-chip circuitry. The dedicated I/O circuitries 11130 are preferably in close proximity to the common circuitry, which generally resides in the central part of the integrated-circuit device 1005.

The dedicated I/O circuitries 11130 enable the FCIC circuitry 1035 to communicate with external hardware, for example, to receive conditional-instruction data. In addition, the dedicated I/O circuitries 11130 provide a way for the various blocks within the common circuitry (e.g., the processor circuitries 5035 and 5075, the external-memory circuitry 7055, and the memory circuitry 7045) to communicate with hardware residing outside the integrated-circuit device 1005.

Note that FIGS. 9–11 illustrate conceptually the layout of integrated-circuit devices 1005 according to the invention. As persons skilled in the art with the benefit of this description of the invention will recognize, one may use the inventive concepts with equal effectiveness in other embodiments. For example, the integrated-circuit devices 1005 may include different numbers, shapes, and orientations of the buses 9010, the common circuitry 9015, and the regions 9005. Moreover, the precise positioning and layout of various blocks within the common circuitry 9015 and other parts of the integrated-circuit device 1005 lend themselves to other embodiments within the scope of the invention. The particular layout and positioning of the various blocks depends on the specifications of a given application, as persons skilled in the art would understand.

Note also that, based on the specifications of a given application, one may make many modifications to the embodiments shown in FIGS. 5–8 and FIG. 11, as persons skilled in the art with the benefit of this description of the invention would understand. For example, one may include other circuit blocks within the integrated-circuit device 1005 (or within a data-processing system built around the integrated-circuit device 1005), as desired. Generally, one may include routing and switching mechanisms that would facilitate communication between virtually any of the blocks. Moreover, the various blocks within and outside the integrated-circuit device 1005 may operate at different speeds or with differing electrical characteristics. One may employ buffer circuitries, interface circuitries, or both, to match the speeds and electrical characteristics of the blocks to facilitate their communication and interaction with each other.

Fast Conditional-instruction Controller Circuitry

As noted above, one aspect of the invention relates to improving system latency when responding to external signals or data that the processor circuitry uses to execute instructions. This aspect of the invention proves advantageous in a variety of data-processing applications, particularly when a data-processing system according to the invention executes a software routine designed for real-time execution. The real-time software routine may constitute a multimedia algorithm, a video-processing algorithm, say, an MPEG-II algorithm, a data-communication or networking algorithm, a signal-processing routine, a control-system algorithm, and the like.

Figure 12:
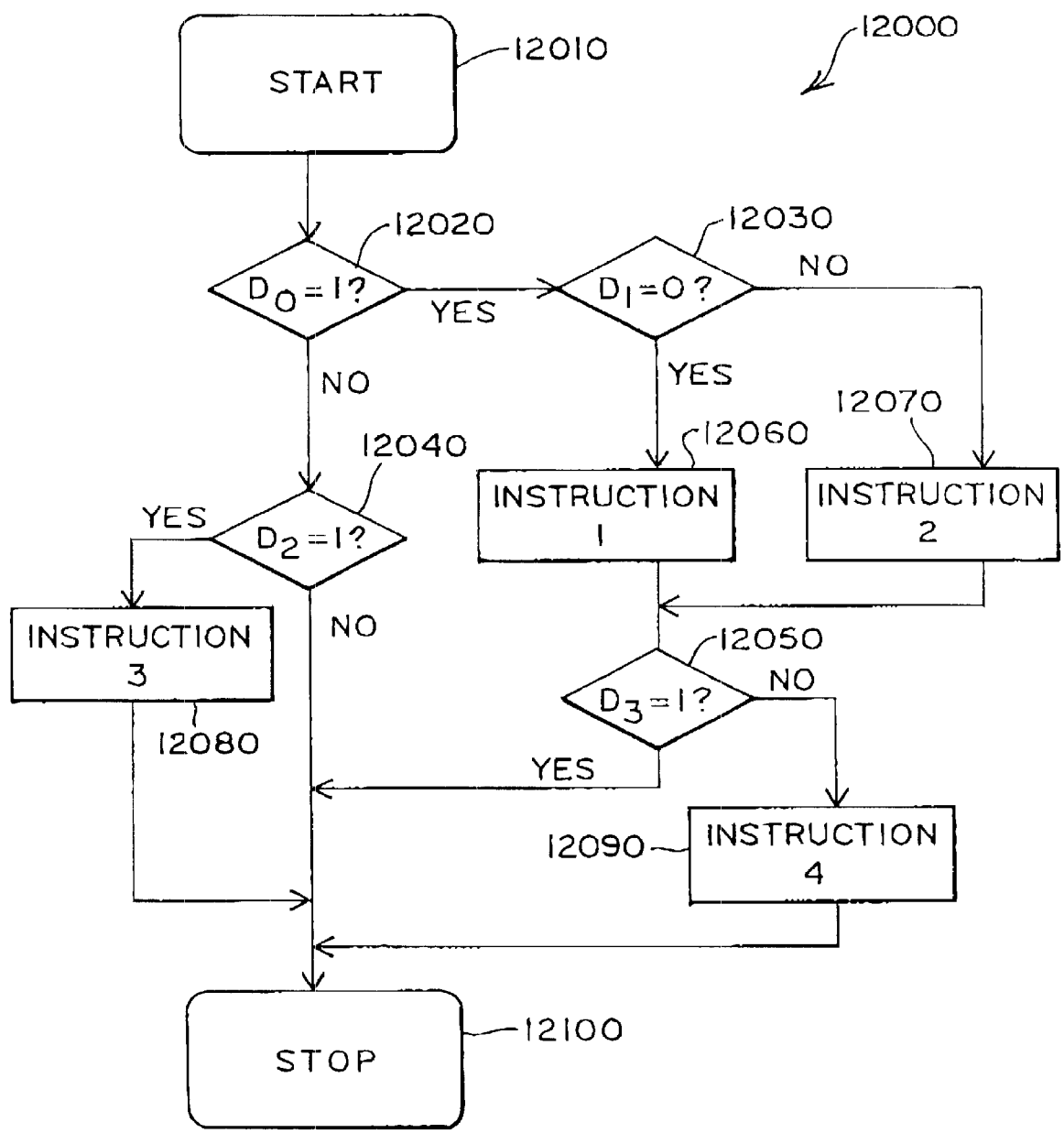
FIG. 12 depicts a flowchart for an exemplary algorithm that includes conditional-branch instructions.

The dependence of instruction execution on external variables or data often arises in the conditional-instruction context. FIG. 12 depicts a flow-chart 12000 of a software routine. The routine includes decision blocks 12020, 12030, 12040, and 12050. The flow of execution at decision blocks 12020, 12030, 12040, and 12050 depends on the values of variables $D_0$, $D_1$, $D_2$, and $D_3$, respectively. The processor circuitry within the data-processing system executes conditional instructions whose outcome depends on the values of the variables. The conditional instructions typically result in branching within the flow of the software routine. In other words, the decision blocks examine (say, for a compare-and-branch instruction) a binary variable or signal whose value equals or depends on the values of the variables $D_0$, $D_1$, $D_2$, and $D_3$. Depending on the results of that examination or comparison, the flow of the software routine may change. Thus, the variables $D_0$, $D_1$, $D_2$, and $D_3$ constitute conditional-instruction data. The conditional-instruction data may correspond to the occurrence of an event, either within the PLD or CPLD that includes data-processing circuitry according to the invention, or outside the data-processing system that includes FCIC circuitry according to the invention. The event may constitute a physical phenomenon or an action by a user or similar other occurrences.

The conditional-instruction data $D_0$, $D_1$, $D_2$, and $D_3$ may represent values from modules or external hardware that perform specific tasks. In typical data-processing systems, the conditional-instruction data may represent signals from parts of the system other than the processor circuitry, or from relatively remote parts of the system, peripherals, or other data-processing systems or circuitry.

To illustrate, consider, for example, decision block 12030. When the routine reaches the block 12030, it examines or tests the value of variable $D_1$. If $D_1=0$, then the routine flows to Instruction 1 (block 12060). On the other hand, if $D_1 \neq 0$, then the routine proceeds to Instruction 2 (block 12070). The data-processing system may receive from an external source signals or data that represent one or more of the conditional-instruction data $D_0$, $D_1$, $D_2$, and $D_3$.

Real-time execution of the routine in flow chart 12000 depend on a number of factors, including the latency that the data-processing system exhibits in response to a change in the conditional-instruction data $D_0$, $D_1$, $D_2$, and $D_3$. In other words, the real-time execution of the routine depends on the system's latency when it responds to real-time changes in conditional-instruction data originating from external so conditional-instruction data, for example, $D_0$, $D_1$, $D_2$, and $D_3$, serve as inputs to a zero-page memory circuitry within FCIC circuitry according to the invention.

Figure 13:
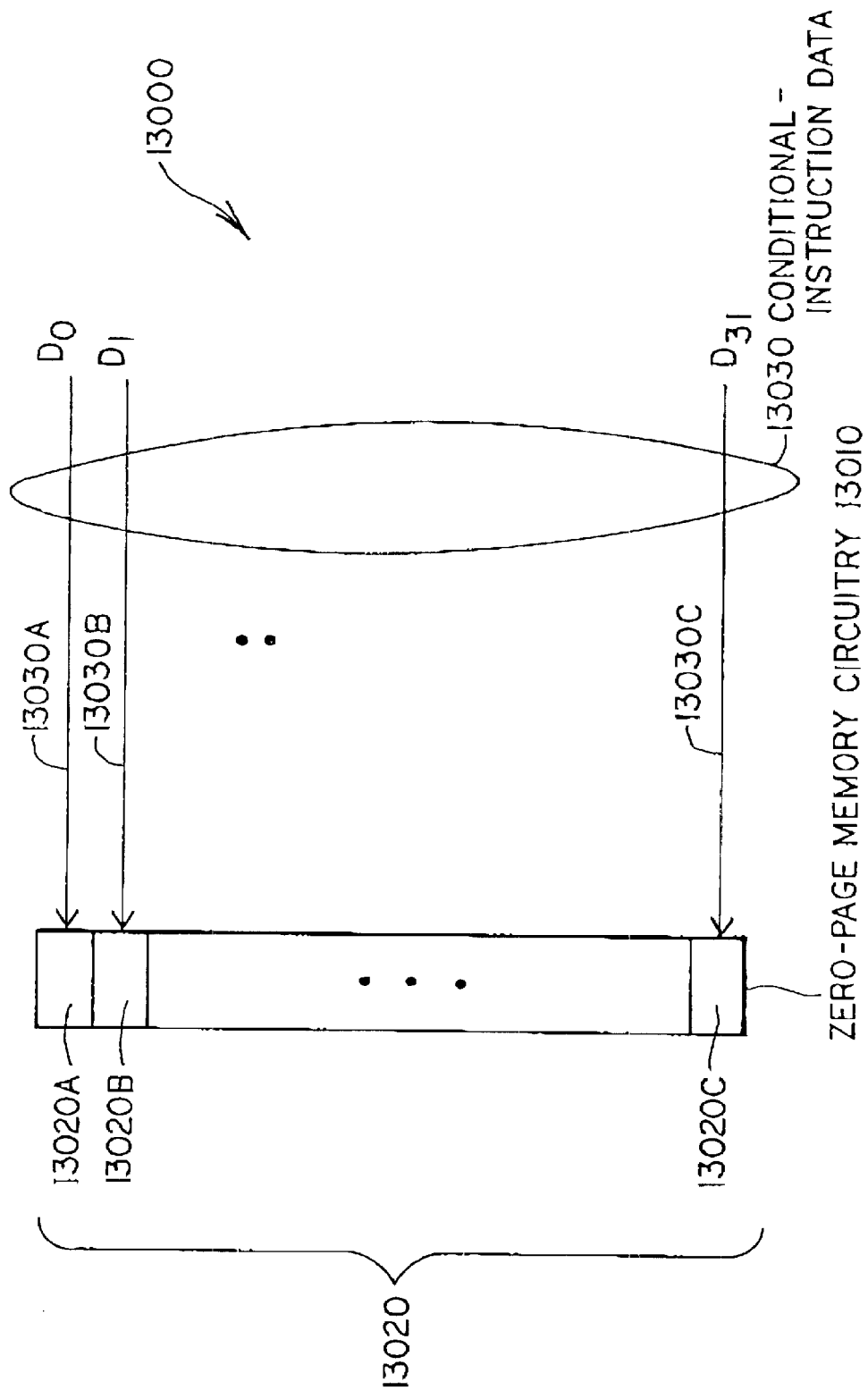
FIG. 13 illustrates a zero-page memory circuitry according to the invention for use in a 32-bit data-processing system.

FIG. 13 shows an embodiment 13000 of a zero-page memory 13010. The zero-page memory 13010 constitutes a part of FCIC circuitry according to the invention. The zero-page memory circuitry 13010 includes a memory circuitry with a storage capacity that depends on a particular application. Each word in the zero-page memory circuitry may include one or more bits, as desired. The zero-page memory circuitry 13010 in the embodiment 13000 includes 32-bit words, although one may use other word widths, a understand.

The zero-page memory circuitry 13010 typically occupies the lower-end of the address map for a processor circuitry. Consider, for example, a 32-bit processor circuitry. The processor circuitry can potentially address $2^{32}$ memory locations. If the memory architecture of the system is a byte wide, then the system has a 4 giga-byte (4 GB) memory address space. The zero-page memory circuitry 13010 resides in the lower part of that address space. The number of memory locations dedicated to the zero-page memory circuitry 13010 varies depending on the specifications of a given system, as persons skilled in the art would understand.

The processor circuitry can access the zero-page memory circuitry 13010 with high-speed. Two factors make possible the high-speed access of the zero-page memory circuitry 13010 by the processor circuitry. First, the zero-page memory circuitry 13010 typically constitutes high-speed memory. In FCIC circuitry according to the invention, the zero-page memory circuitry 13010 preferably constitutes SRAM memory circuitry. Thus, the processor circuitry may access the contents of the zero-page memory circuitry 13010 in a relatively short amount of time. Second, because the zero-page memory occupies the low-end of the system memory map, the processor may access it without adding any offset to the memory address.

Referring to FIG. 13, a plurality of signal lines 13030 couple to memory cells 13020 within the zero-page memory circuitry 13010. More specifically, signal line 13030A couples to memory cell 13020A, signal line 13030B couples to memory cell 13020B, and so on. The signal lines 13030 also couple to the sources of the conditional-instruction data. As noted above, the sources of the conditional-instruction data may reside outside the data-processing system or outside a PLD or CPLD according to the invention that performs data-processing tasks. For improved performance, the data-processing system should receive the conditional-instruction data through high-speed, low-latency signal paths, for example, through the dedicated I/O circuitry 11130 shown in FIG. 11.

FIG. 13 denotes the conditional-instruction data as $D_0$ through $D_{31}$. The signal line 13030A couples to the source of conditional-instruction datum $D_0$, the signal line 13030B couples to the source of conditional-instruction datum $D_1$, and so on. The signal lines 13030 provide the conditional-instruction data $D_0$–$D_{31}$, to the zero-page memory circuitry 13010 in an asynchronous manner. Put another way, the signal lines 13030 write the conditional-instruction data $D_0$–$D_{31}$ to the zero-page memory circuitry 13010 without synchronizing to a system clock signal or to a processor-circuitry clock signal. The asynchronous writing of the conditional-instruction data into the zero-page memory circuitry 13010 helps in part to improve the overall system latency.

The processor circuitry reads the contents of the zero-page memory circuitry 13010 in a synchronous manner. In other words, the processor circuitry uses a clock signal to access and read the zero-page memory circuitry 13010. Recall from the description above that the processor circuitry uses the conditional-instruction data to execute conditional instructions. In FCIC circuitry according to the invention, the processor circuitry may access the conditional-instruction data through the zero-page memory circuitry 13010, thus overcoming the relatively long delays associated with interrupt-driven or register-input data-processing systems. Thus, data-processing systems that include FCIC circuitry according to the invention exhibit low latency when executing routines that require fast response, such as real-time data-processing routines.

Figure 14A:
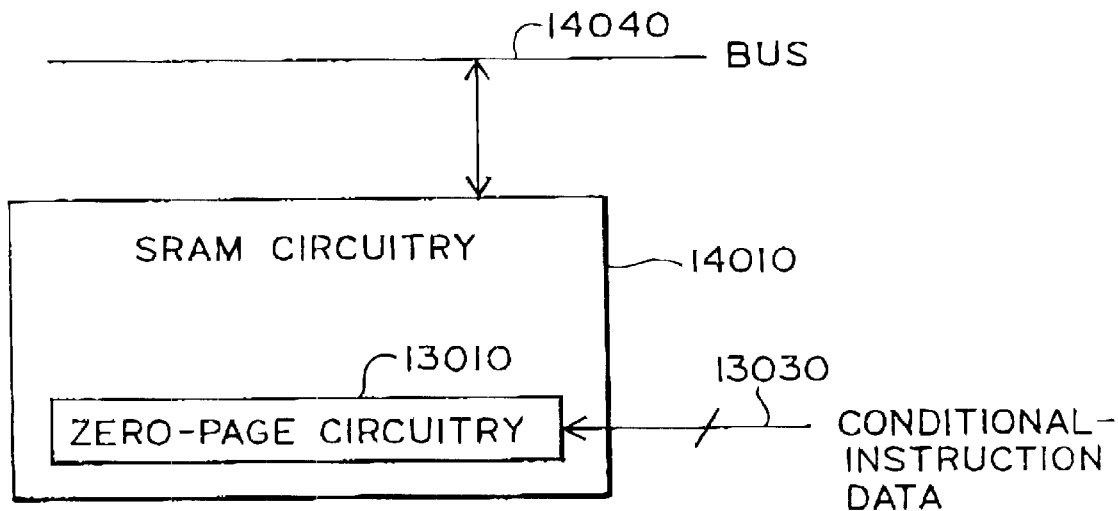
FIG. 14A shows a diagram of a zero-page memory circuitry for use in a fast conditional-instruction controller (FCIC) circuitry according to the invention.

FIG. 14A shows an architectural block diagram of the zero-page memory circuitry 13010. The zero-page memory circuitry 13010 preferably resides within an SRAM circuitry 14010. The SRAM circuitry 14010 includes high-speed memory circuitry. The zero-page memory circuitry 13010 accepts conditional-instruction data via the signal lines 13030. The zero-page circuitry 13010 uses memory cells that are similar to conventional SRAM memory cells. Unlike a typical conventional SRAM memory cell, however, memory cells within the zero-page circuitry 13010 accept conditional-instruction data asynchronously.

The SRAM circuitry 14010 couples to the bus 14040. The bus 14040 may include a variety of signal lines, for example, address, data, status, and control signal lines. The bus 14040 may be the same or similar to the buses 5005 and 5010 in FIGS. 5 and 7, as desired. The processor circuitry (not shown explicitly in FIG. 14A) may communicate with the zero-page memory circuitry 13010 and the SRAM circuitry 14010 via the bus 14040. The processor circuitry may constitute the processor circuitry 5035 or the processor circuitry 5075 of FIGS. 5–8 and 11, as desired.

Figure 14B:
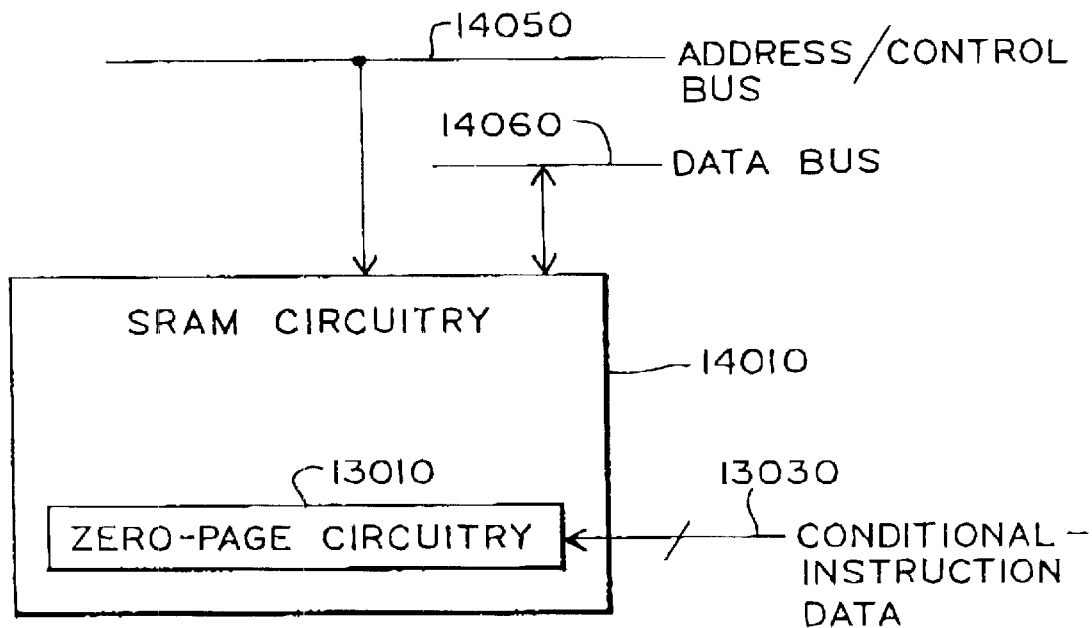
FIG. 14B depicts another diagram of a zero-page memory circuitry for use in a FCIC circuitry according to the invention.

FIG. 14B shows a variation of the circuitry shown in FIG. 14A. In FIG. 14B, the bus circuitry includes two buses: an address/control bus 14050 and a data bus 14060. The circuitry shown in FIG. 14B may be suitable for use in the systems shown in FIGS. 6 and 8. Recall that, in the systems of FIGS. 6 and 8, the bus circuitry includes two separate bus structures that includes address/control buses 6005 and 6010, and data buses 6015 and 6020. The bus 14050 may be similar or the same as the address/control buses 6005 or 6010. Similarly, the bus 14060 may be similar or the same as the data buses 6015 and 6020. The processor circuitry (not shown explicitly in FIG. 14B) may communicate with the zero-page memory circuitry 13010 and the SRAM circuitry 14010 via the buses 14050 and 14060. The processor circuitry may constitute the processor circuitry 5035 or the processor circuitry 5075 of FIGS. 5–8 and 11, as desired.

FIG. 15 shows timing diagrams 15000 corresponding to the operation of FCIC circuitry according to the invention. The timing diagrams 15000 include a waveform 15010 of a clock signal. The clock signal 15010 may constitute the system's clock or the clock that provides timing signals for the processor circuitry. The clock signal has a period denoted as $T_{clk}$. The clock signal also has a setup time shown as $t_{su}$. The timing diagram 15000 also includes a waveform 15020 of a conditional-instruction data signal. The conditional-instruction data signal may, for example, correspond to one of the variables $D_0$, $D_1$, $D_2$, or $D_3$ in FIG. 12.

A third waveform 15030 in FIG. 15 illustrates the data signal that the processor circuitry uses to execute the conditional instruction. The conditional instruction may constitute a conditional compare, branch, test, or other instruction. The processor obtains the data signal by accessing the zero-page memory circuitry (either directly or through a memory controller or other type of circuitry) and reading a conditional-instruction datum.

Within a time period shown as $t_0$ in FIG. 15, the processor circuitry executes the instruction and provides the results. The processor circuitry may provide the result to a port, a register, a memory location, and the like, as desired. Execution of the software routine then commences with the next instruction in the flow diagram of the software routine or algorithm. The timing diagram 15000 includes a fourth waveform 15040. The waveform 15040 corresponds to a result of the execution by the processor circuitry of the conditional instruction. Note that the results of the conditional instruction, for example, a conditional branch instruction, depend on the conditional-instruction datum. Note also that, with the signal timing shown in FIG. 13, the data-processing system according to the invention responds to a change in the external data or signal within $t_0+T_{clk}$.

On average, a data-processing system that uses FCIC circuitry according to the invention exhibits a latency of half a clock cycle for reading the value of the conditional-instruction datum or data. In other words, assuming a normal distribution in the changes in the conditional-instruction datum, over a relatively large number of read operations, the system will on average read and respond to a change in the datum within a half clock cycle, or $T_{clk}/2$. On the other hand, if the conditional-instruction datum changes just after the positive edge of the clock signal, the system does not use the new value until the next clock cycle. In the later case, the system responds to the change in the datum in one clock cycle, or $T_{clk}$. Thus, the system response latency, $t_r$, has the following lower and upper bounds:

$$\frac{1}{2}T_{clk} \le t_r \le T_{clk}.$$

In contrast, in an interrupt-driven data-processing system, the latency may be on the order of 20–30 clock cycles—or even higher—each time the system examines the values of a conditional-instruction datum or other comparable external variable. When one considers that a main software routine may invoke the routine shown in FIG. 12 numerous times, the potential impact on the overall latency of the data-processing system may become too severe for satisfactory performance. The interrupt-driven system may therefore exhibit too much latency to respond in real time to changes in the variables or data signals. As a result, the overall system performance may suffer or fail to meet its specifications and requirements.

Figure 16A:
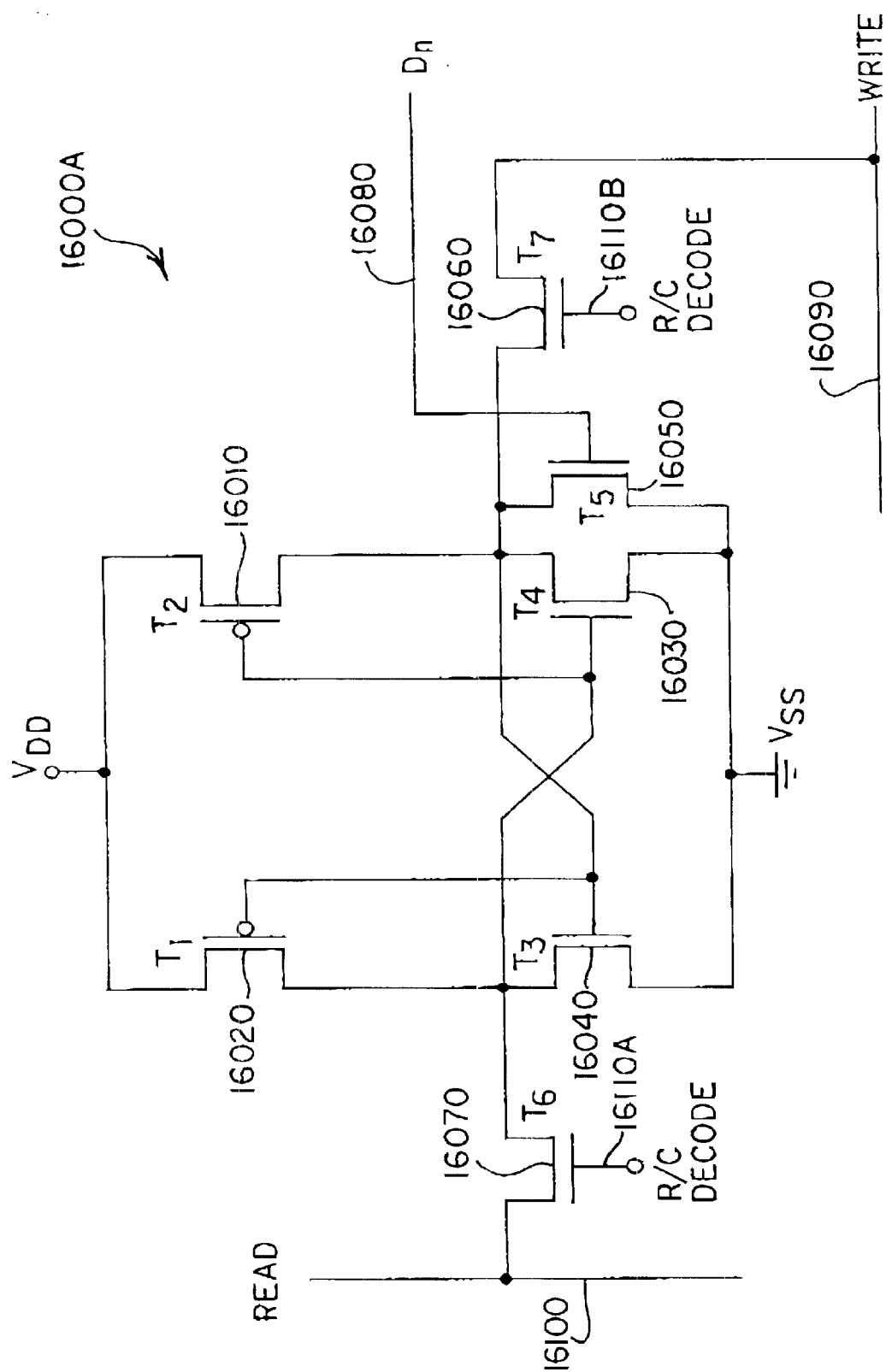
FIG. 16A shows an embodiment of a memory-cell in a zero-page memory circuitry according to the invention.

FIG. 16A shows an embodiment 16000A of a memory cell for use in zero-page circuitry according to the invention. The memory cell provides for asynchronous writing of conditional-instruction data to the cell. The memory cell also features synchronous reading of the conditional-instruction data from the cell. Thus, the memory cell constitutes asynchronous-write, synchronous-read (AWSR) circuitry.

Similar to a conventional static memory (SRAM) cell, the memory cell in FIG. 16A uses transistors $T_1$, $T_2$, $T_3$, and $T_4$. Transistors $T_1$ and $T_2$ are p-channel devices, whereas transistors $T_3$ and $T_4$ are n-channel devices. The memory cell also includes n-channel access transistors $T_6$ and $T_7$. By providing appropriate control signals to gate terminals 16110A and 16110B, respectively, of transistors $T_6$ and $T_7$, one may read a value from the memory cell or write a value into the memory cell. The control signals constitute row and column decode signals (labeled as "R/C Decode" in FIG. 16).

The normal operation of the cell (i.e., operation as a regular memory cell) parallels the operation of a conventional SRAM cell. Suppose, for example, that a data source seeks to write a logic datum, say, binary logic "0" (a voltage level typically close to the ground potential or $V_{SS}$), into the cell. To do so, the data source places the complement of the logic datum, or a binary "1" (i.e., the complement of the logic value that the data source seeks to write into the cell), on write line 16090. The R/C Decode line 16110B then activates and couples the gate of transistor $T_3$ to the logic "1" level. Transistor $T_3$ begins to turn on and its drain voltage starts to drop. The dropping voltage on the drain of transistor $T_3$ pulls the gate of transistor $T_4$ towards logic "0" (a voltage level typically close to the ground voltage or $V_{SS}$). Transistor $T_4$ thus starts to turn off and its drain voltage begins to rise. Because of positive feedback within the circuit, the rising drain voltage of transistor $T_4$ in turn causes transistor $T_3$ to turn on harder. The positive feedback eventually causes $T_3$ to turn fully on and $T_4$ to turn fully off. Thus, the drain voltage of $T_3$ falls to nearly the ground potential, or $V_{SS}$. In other words, the cell holds or stores the desired logic "0" value.

One may write a logic "1" value into the cell in a similar manner. The data source places the complement of the desired logic datum, or a binary "0" (i.e., the complement of the logic value that the data source seeks to write into the cell), on write line 16090. The R/C Decode line 161101 then activates and couples the gate of transistor $T_3$ to the logic "0" level. Transistor $T_3$ begins to turn off and its drain voltage starts to rise. The rising voltage on the drain of transistor $T_3$ pulls the gate of transistor $T_4$ towards logic "1." Transistor $T_4$ thus starts to turn on and its drain voltage begins to fall. The falling drain voltage of transistor $T_4$ in turn causes transistor $T_3$ to turn off even more. The positive feedback eventually causes $T_3$ to turn fully off and $T_4$ to turn fully on. Thus, the drain voltage of $T_3$ rises to nearly the supply voltage, or $V_{DD}$ In other words, the cell holds or stores the desired logic "1" value.

To retrieve the value stored within the cell, one uses the read operation. The read operation commences by R/C Decode line 16110A activating (going to a logic "1" level), thus turning on transistor $T_6$. Transistor $T_6$ operates as a pass transistor. With transistor $T_6$ in the on state, the voltage level at the drain of transistor $T_6$, which represents the binary-logic value stored in the cell, appears on read line 16100. A buffer or read amplifier circuitry (not shown explicitly in FIGS. 16A and 16B) may then sample or read the stored datum from line 16100 and provide it to other circuitry, as desired.

Note that the normal write operation, e.g., the activation of the R/C Decode line 16110B, is typically synchronous. In other words, the timing of the normal write operation occurs in synchronization with a clock signal. Note also that, similar to the normal write operation, the read operation, e.g., the activation of the R/C Decode line 16110A, is typically synchronous. Put another way, the timing of the read operation occurs in synchronization with a clock signal.

The memory cell in FIG. 16A also includes an n-channel transistor, $T_5$, in parallel with transistor $T_4$. Transistor $T_5$ facilitates the asynchronous writing of a conditional-instruction datum, say, $D_n$, into the memory cell. In contrast to the normal write operation described above, the asynchronous write operation does not synchronize to a clock signal. The asynchronous write operation occurs as follows: Suppose that $D_n$ has a binary value of "0." A binary "0" level on $D_n$ asserts a binary "0" level at the gate terminal 16080 of transistor $T_5$ and turns it off. Transistor $T_5$ therefore does not conduct any current (except for negligible leakage and parasitic currents). Thus, transistor $T_5$ does not affect the operation of the memory cell (i.e., the normal write and read operations).

Suppose that $D_n$ rises to a logic "1" level. A logic "1" level on the gate terminal 16080 of transistor $T_5$ turns it on and causes its drain voltage and the gate voltage of transistor $T_3$ to drop. Transistor $T_3$ begins to turn off and its drain voltage starts to rise. The rising voltage on the drain of transistor $T_3$ pulls the gate of transistor $T_4$ towards logic "1." Transistor $T_4$ thus starts to turn on and its drain voltage begins to fall. The falling drain voltage of transistor $T_4$ in turn causes transistor $T_3$ to turn off even more. The positive feedback eventually causes $T_3$ to turn fully off and $T_4$ to turn fully on. Thus, the drain voltage of $T_3$ rises to nearly the supply voltage, or $V_{DD}$ and the cell holds the desired $D_n$ value of binary "1."

Subsequently, the processor circuitry or other circuitry that uses the value of conditional-instruction datum $D_n$ reads the memory cell as part of instruction execution and, generally, as part of the data-processing algorithm. The memory cell provides a $D_n$ value of binary "1," and the processor circuitry executes the conditional instruction based on that value. The processor circuitry may also reset the memory cell (by using, for example, the normal write cycle), thus making it ready to accept a subsequent value of $D_n$. Thus, rather than using an interrupt system with a relatively long latency, a data processing system may use FCIC circuitry according to the invention to reduce the latency within the system.

Figure 16B:
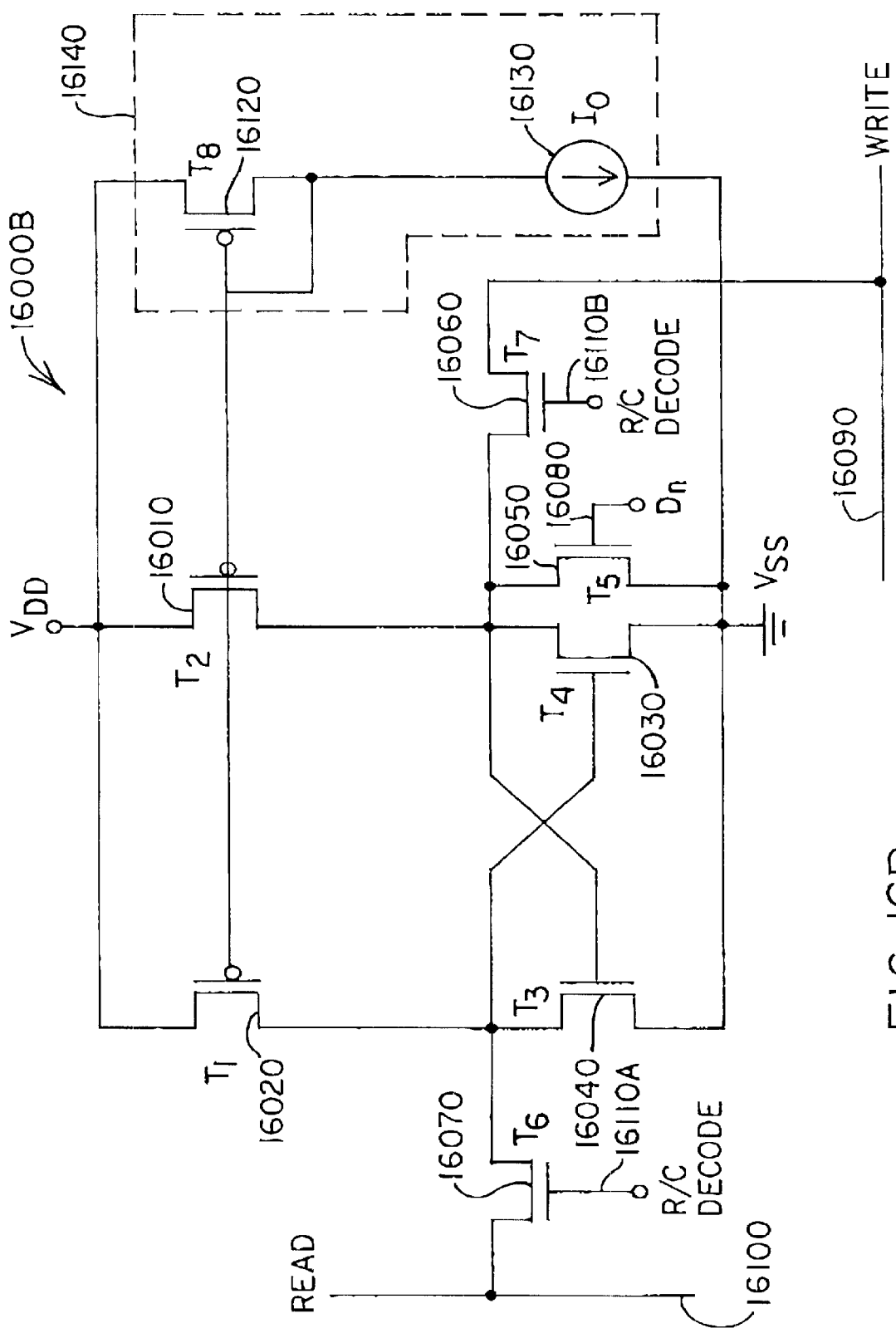
FIG. 16B depicts another embodiment of a memory-cell in a zero-page memory circuitry according to the invention. This embodiment uses a current source that a plurality of memory cells share.

FIG. 16B illustrates an embodiment 16000B of another memory cell for use in FCIC circuitry according to the invention. The memory cell in FIG. 16B functions similarly to the memory cell 16A. In the memory cell of FIG. 16B, however, the gate terminals of transistors $T_1$ and $T_2$ couple to a current-mirror circuitry 16140. The current-mirror circuitry 16140 includes a transistor $T_8$ and a current source $I_0$. The current-mirror circuitry 16140 operates as a conventional current mirror, known to persons of ordinary skill in the art. A current substantially equal to $I_0$ flows through either $T_1$ or $T_2$, depending, respectively, on whether $T_3$ or $T_4$ are in the on state. Note that several memory cells may use the same current-mirror circuitry 16140. That sharing of circuitry simplifies the layout of the memory cells and allows more dense silicon integration. The current-mirror circuitry 16140, however, does not alter the overall function that the memory cell performs.

Note that the zero-page memory circuitry according to the invention preferably uses static-type memory circuitry. One may use other types of memory circuitry, for example, RAM, SDRAM, flash memory, and the like, as desired. The choice of memory technology depends on a number of factors, such as system performance, cost, etc., as persons skilled in the art would understand. Any modifications to the embodiments of FIGS. 16A and 16B will also be within the knowledge of persons skilled in the art who have the benefit of this description of the invention. Note also that one may use active-low logic circuitry by making modifications to the circuitry shown and described here. Those modifications will also fall within the knowledge of a person of ordinary skill in the art.

The embodiments described here and shown in the accompanying diagram mainly address the application of the inventive concepts to real-time data-processing systems. Note, however, that one may effectively apply the inventive concepts to other data-processing systems and applications, as desired, for example, in data-processing systems whose specifications do not include real-time data processing. The inventive concepts described here potentially improve the latency of a wide variety of data-processing systems, particularly high-performance systems.

Further modifications and alternative embodiments of this invention will be apparent to persons skilled in the art in view of this description of the invention. Accordingly, this description teaches those skilled in the art the manner of carrying out the invention and are to be construed as illustrative only. The forms of the invention shown and described should be taken as the presently preferred embodiments.

Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

I claim:

1. A configurable integrated-circuit device, comprising:
   a plurality of regions that each include configurable electronic circuitry; and
   common circuitry that provides at least one signal to at least two regions of the plurality of regions,
   wherein the common circuitry comprises at least one processor circuitry, and
   the common circuitry and the at least two regions are positioned within the configurable integrated-circuit device so as to improve the latencies of the at least one signal to each of the at least two regions.

2. A. The configurable integrated-circuit device of claim 1, in which the common circuitry further comprises at least one memory circuitry that communicates with the at least one processor circuitry.

3. The configurable integrated-circuit device of claim 2, further comprising at least one bus circuitry that couples the common circuitry to the plurality of regions within the configurable integrated-circuit device.

4. The configurable integrated-circuit device of claim 3, in which the common circuitry further comprises a clock generator circuitry that provides at least one clock signal.

5. The configurable integrated-circuit device of claim 4, further comprising at least one port circuitry that facilitates communication between the at least two regions.

6. The configurable integrated-circuit device of claim 5, further comprising at least one dual-port memory circuitry coupled to the at least two regions.

7. The configurable integrated-circuit device of claim 6, further comprising input/output (IO) circuitry that facilitates communication between the common circuitry and circuitry external to the configurable integrated-circuit device.

8. The configurable integrated-circuit device of claim 7, in which the common circuitry is positioned at substantially the same distance from each region of the plurality of regions.

9. The configurable integrated-circuit device of claim 7, in which the common circuitry is positioned at substantially the same distance from each of the at least two regions of the plurality of regions.

10. A data-processing system including a configurable integrated-circuit device according to claim 4, the data-processing system further comprising at least one peripheral circuitry coupled to the configurable integrated-circuit device.

11. A data-processing system including a configurable integrated-circuit device according to claim 3, the data-processing system further comprising at least one peripheral circuitry coupled to the configurable integrated-circuit device.

12. A data-processing system including a configurable integrated-circuit device according to claim 2, the data-processing system further comprising at least one peripheral circuitry coupled to the configurable integrated-circuit device.

13. A data-processing system including a configurable integrated-circuit device according to claim 1, the data-processing system further comprising at least one peripheral circuitry coupled to the configurable integrated-circuit device.

14. A configurable integrated-circuit device, comprising:
   a plurality of regions that each include configurable electronic circuitry; and
   common circuitry that provides at least one signal to at least two regions of the plurality of regions,
   wherein the common circuitry comprises at least one processor circuitry, and
   the common circuitry and the at least two regions are positioned within the configurable integrated-circuit device so that the latencies of the at least one signal to each of the at least two regions tend to be equalized.

15. The configurable integrated-circuit device of claim 14, in which the common circuitry further comprises at least one memory circuitry that communicates with the at least one processor circuitry.

16. The configurable integrated-circuit device of claim 15, further comprising at least one bus circuitry that couples the common circuitry to the plurality of regions within the configurable integrated-circuit device.

17. The configurable integrated-circuit device of claim 16, in which the common circuitry further comprises a clock generator circuitry that provides at least one clock signal.

18. The configurable integrated-circuit device of claim 17, further comprising at least one port circuitry that facilitates communication between the at least two regions.

19. The configurable integrated-circuit device of claim 18, further comprising at least one dual-port memory circuitry coupled to the at least two regions.

20. The configurable integrated-circuit device of claim 19, further comprising input/output (IO) circuitry that facilitates communication between the common circuitry and circuitry external to the configurable integrated-circuit device.

21. The configurable integrated-circuit device of claim 20, in which the common circuitry is positioned centrally with respect to the plurality of regions.

22. The configurable integrated-circuit device of claim 20, in which the common circuitry is positioned centrally with respect to the at least two regions of the plurality of regions.

23. A data-processing system including a configurable integrated-circuit device according to claim 17, the data-processing system further comprising at least one peripheral circuitry coupled to the configurable integrated-circuit device.

24. A data-processing system including a configurable integrated-circuit device according to claim 16, the data-processing system further comprising at least one peripheral circuitry coupled to the configurable integrated-circuit device.

25. A data-processing system including a configurable integrated-circuit device according to claim 15, the data-processing system further comprising at least one peripheral circuitry coupled to the configurable integrated-circuit device.

26. A data-processing system including a configurable integrated-circuit device according to claim 14, the data-processing system further comprising at least one peripheral circuitry coupled to the configurable integrated-circuit device.

27. A programmable logic-device, comprising:
   a plurality of regions that each include configurable electronic circuitry;
   bus circuitry coupled to the plurality of regions; and
   common circuitry coupled to the bus circuitry,
   wherein the common circuitry comprises at least one processor circuitry, and
   the common circuitry provides a signal to the plurality of regions through the bus circuitry, and
   wherein the common circuitry and the plurality of regions are positioned within the programmable logic-device so as to improve the latencies of the signal to each region.

28. The programmable logic-device of claim 27, in which the common circuitry further comprises at least one memory circuitry configured to communicate with the at least one processor circuitry.

29. The programmable logic-device of claim 28, further comprising configurable interconnect circuitry coupled to each region.

30. The programmable logic-device of claim 29, further comprising input-output (I/O) circuitry coupled to the common circuitry.

31. The programmable logic-device of claim 30, in which the input-output circuitry is further coupled to the plurality of regions.

32. The programmable logic-device of claim 31, further comprising a memory controller circuitry adapted to communicate with memory circuitry external to the programmable logic-device.

33. The programmable logic-device of claim 32, in which the common circuitry further comprises a dual-port memory circuitry adapted to facilitate communication between a plurality of processor circuitries within the common circuitry.

34. The programmable logic-device of claim 33, which includes four regions, each region positioned in a quadrant of the programmable logic-device.

35. The programmable logic-device of claim 34, in which the bus circuitry includes a horizontal bus circuitry and a vertical bus circuitry that intersects the horizontal bus circuitry, wherein the intersection of the horizontal bus circuitry and the vertical bus circuitry overlaps at least in part with the common circuitry.

36. A data-processing system including a programmable logic-device according to claim 31, the data-processing system further comprising at least one peripheral circuitry coupled to the programmable logic-device.

37. A data-processing system including a programmable logic-device according to claim 30, the data-processing system further comprising at least one peripheral circuitry coupled to the programmable logic-device.

38. A data-processing system including a programmable logic-device according to claim 29, the data-processing system further comprising at least one peripheral circuitry coupled to the programmable logic-device.

39. A data-processing system including a programmable logic-device according to claim 28, the data-processing system further comprising at least one peripheral circuitry coupled to the programmable logic-device.

40. A data-processing system including a programmable logic-device according to claim 27, the data-processing system further comprising at least one peripheral circuitry coupled to the programmable logic-device.

41. A method of improving latency in a configurable integrated-circuit device, comprising:
   providing the configurable integrated-circuit device;
   partitioning the configurable integrated-circuit device into a plurality of regions that each include configurable electronic circuitry;
   including within the configurable integrated-circuit device a common circuitry that provides at least one signal to at least two regions of the plurality of regions;
   including in the common circuitry at least one processor circuitry; and
   positioning the common circuitry and the at least two regions within the configurable integrated-circuit device so as to improve the latencies of the at least one signal to each of the at least two regions.

42. The method of claim 41, which further comprises including in the common circuitry at least one memory circuitry configured to communicate with the at least one processor circuitry.

43. The method of claim 42, which further comprises including in the configurable integrated-circuit device at least one bus circuitry adapted to couple the common circuitry to the plurality of regions of the integrated-circuit device.

44. The method of claim 43, which further comprises including in the common circuitry a clock generator circuitry adapted to provide at least one clock signal.

45. The method of claim 44, which further comprises including in the integrated-circuit device at least one port circuitry adapted to facilitate communication between the at least two regions.

46. The method of claim 45, which further comprises including in the integrated-circuit device at least one dual-port memory circuitry coupled to the at least two regions.

47. The method of claim 46, which further comprises including in the integrated-circuit device at least one dedicated input/output (IO) circuitry adapted to facilitate communication between the common circuitry and circuitry external to the integrated-circuit device.

48. The method of claim 47, which further comprises positioning the common circuitry at substantially the same distance from each region of the plurality of regions.

49. The method of claim 47, which further comprises positioning the common circuitry at substantially the same distance from each of the at least two regions of the plurality of regions.

50. A method of improving latency in a configurable integrated-circuit device, comprising:

providing the configurable integrated-circuit device;

partitioning the configurable integrated-circuit device into a plurality of regions that each include configurable electronic circuitry;

including within the configurable integrated-circuit device a common circuitry that provides at least one signal to at least two regions of the plurality of regions;

including in the common circuitry at least one processor circuitry; and positioning the common circuitry and the at least two regions within the configurable integrated-circuit device so that the latencies of the at least one signal to each of the at least two regions tend to be equalized.

51. The method of claim 50, which further comprises including in the common circuitry at least one memory circuitry configured to communicate with the at least one processor circuitry.

52. The method of claim 51, which further comprises including in the configurable integrated-circuit device at least one bus circuitry adapted to couple the common circuitry to the plurality of regions of the integrated-circuit device.

53. The method of claim 52, which further comprises including in the common circuitry a clock generator circuitry adapted to provide at least one clock signal.

54. The method of claim 53, which further comprises including in the integrated-circuit device at least one port circuitry adapted to facilitate communication between the at least two regions.

55. The method of claim 54, which further comprises including in the integrated-circuit device at least one dual-port memory circuitry coupled to the at least two regions.

56. The method of claim 55, which further comprises including in the integrated-circuit device at least one dedicated input/output (IO) circuitry adapted to facilitate communication between the common circuitry and circuitry external to the integrated-circuit device.

57. The method of claim 56, which further comprises positioning the common circuitry at substantially the same distance from each region of the plurality of regions.

58. The method of claim 56, which further comprises positioning the common circuitry at substantially the same distance from each of the at least two regions of the plurality of regions.

* * * * *